United States Patent [19]

Norman

[11] Patent Number: 4,831,573

[45] Date of Patent: May 16, 1989

[54] PROGRAMMABLE INTEGRATED CIRCUIT MICRO-SEQUENCER DEVICE

[75] Inventor: Kevin A. Norman, Belmont, Calif.

[73] Assignee: Altera Corporation, Santa Clara, Calif.

[21] Appl. No.: 23,054

[22] Filed: Mar. 6, 1987

[51] Int. Cl.[4] .............................................. G11C 11/40
[52] U.S. Cl. ..................................... 364/716; 307/465
[58] Field of Search ......................... 364/716; 307/465

[56] References Cited

U.S. PATENT DOCUMENTS

| 4,578,771 | 3/1986 | O'Hara, Jr. | 364/716 |
| 4,677,318 | 6/1987 | Veenstra | 307/465 |
| 4,697,105 | 7/1987 | Moy | 307/465 |
| 4,721,868 | 1/1988 | Cornell et al. | 307/465 |

Primary Examiner—David H. Malzahn
Attorney, Agent, or Firm—Rosenblum, Parish & Bacigalupi

[57] ABSTRACT

A programmable integrated circuit micro-sequencer apparatus including a dynamically programmable logic device (DPLD) combined with an EPROM look-up table to form a novel look-up table programmable logic device (LTPLD) which is combined with a register to form a stand alone micro-sequencer (SAM) that may be used to implement state machines and microcoded controller devices. The usefulness of the present invention is further expanded by the addition, in various other embodiments, of code look-up tables, priority encoders, multiplexors, stacks and counters and all associated control circuits.

19 Claims, 20 Drawing Sheets

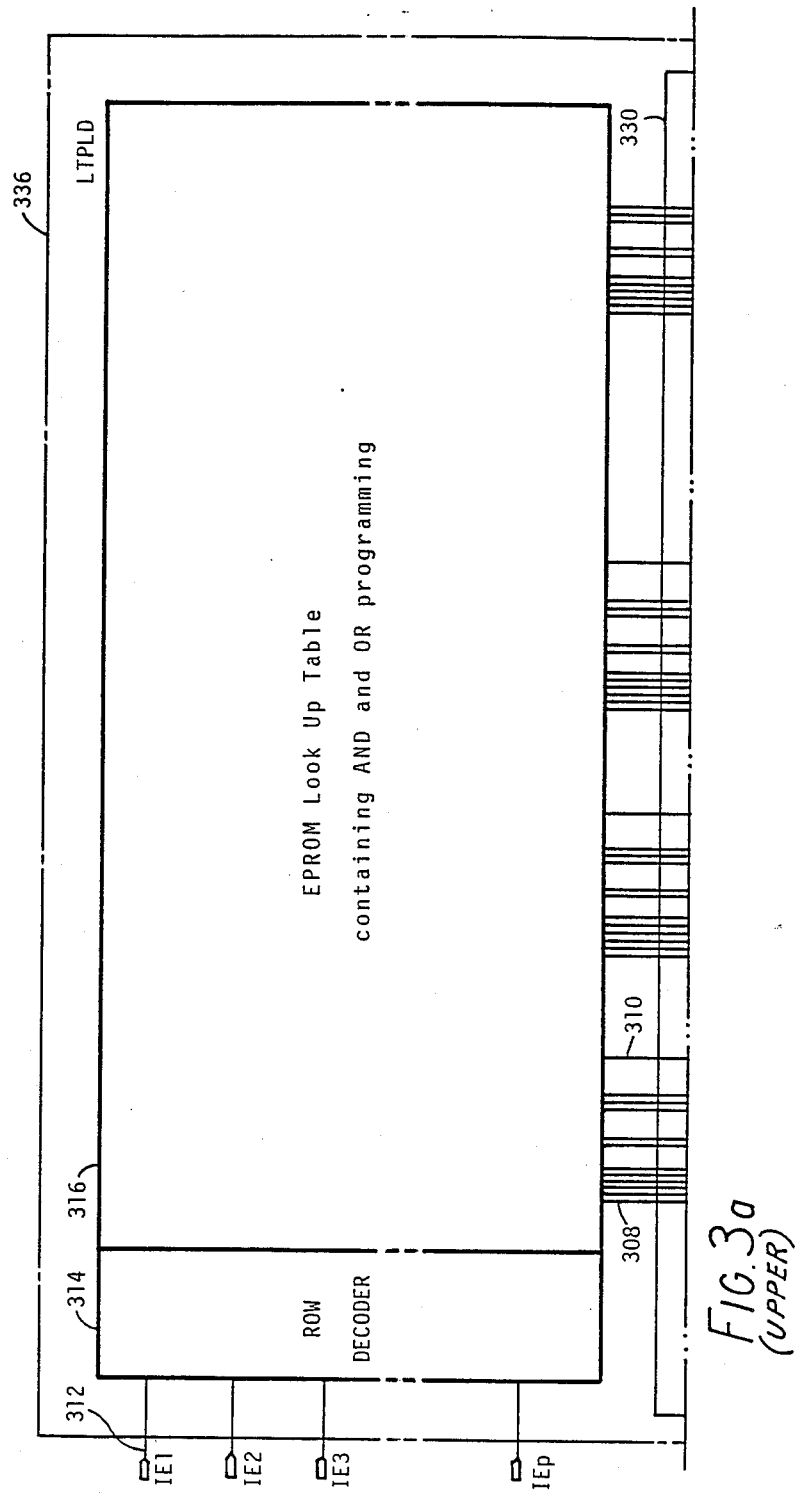
FIG. 3a (UPPER)

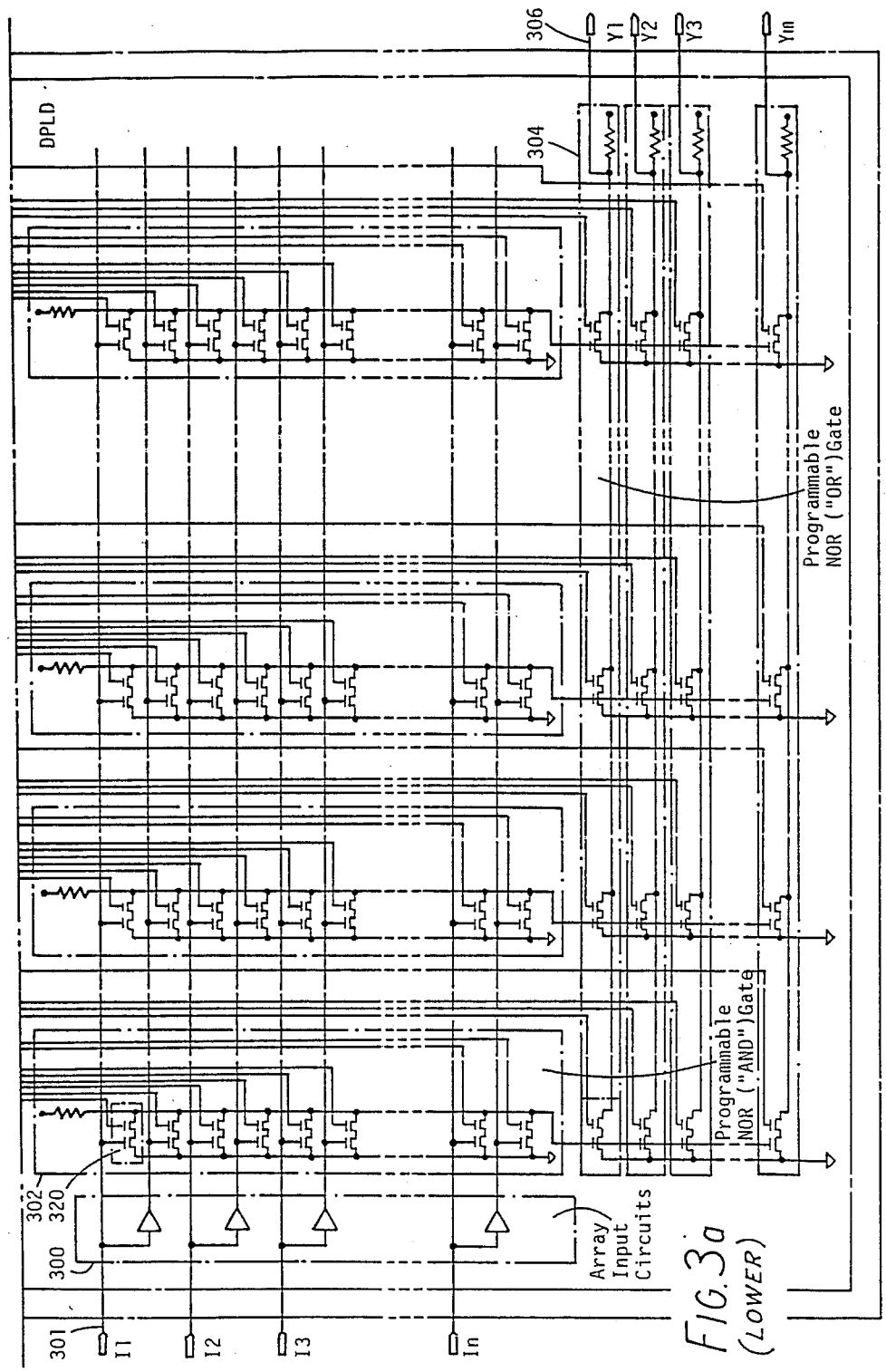
FIG. 3a (LOWER)

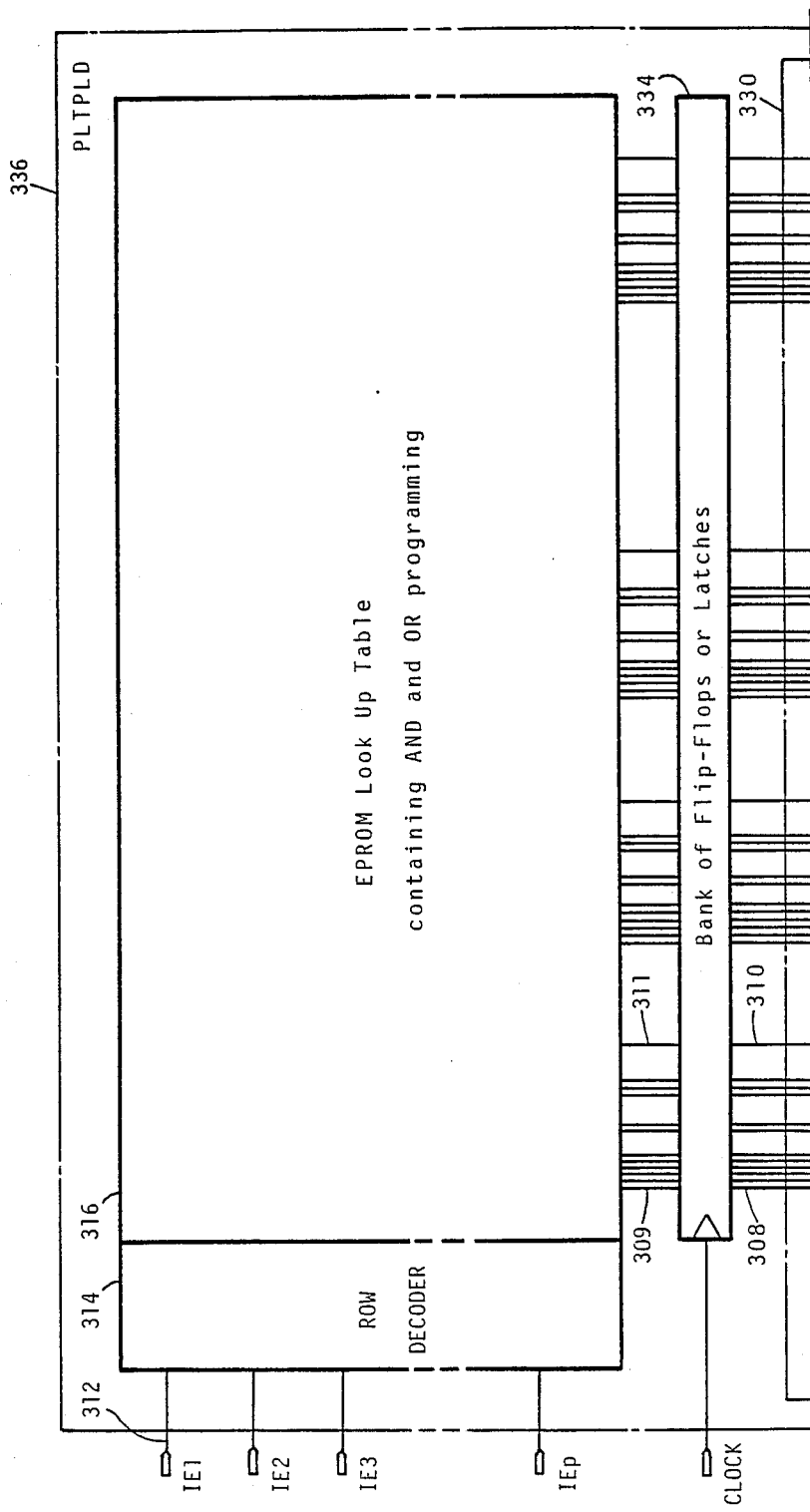
FIG. 3b (UPPER)

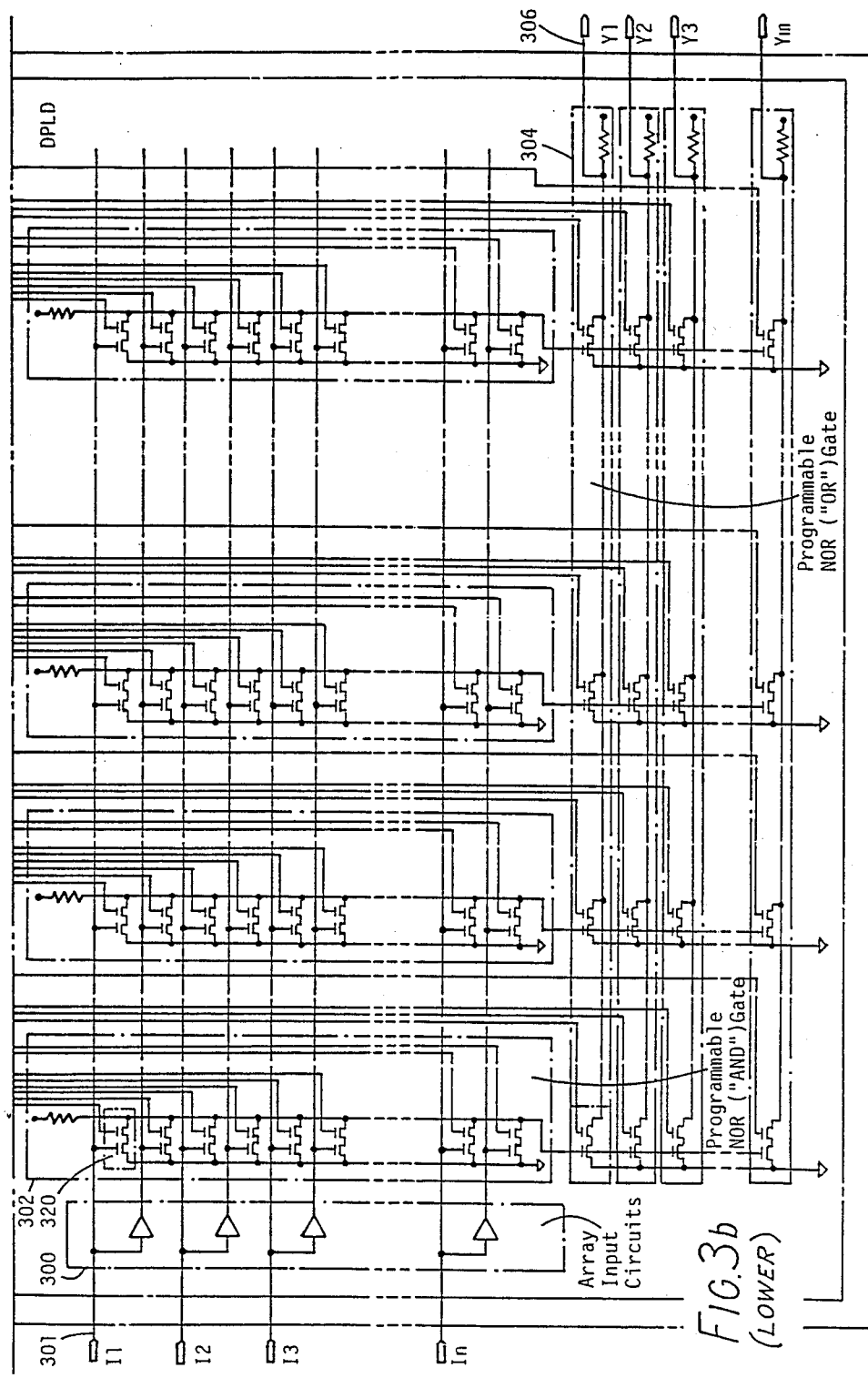
FIG.3b (LOWER)

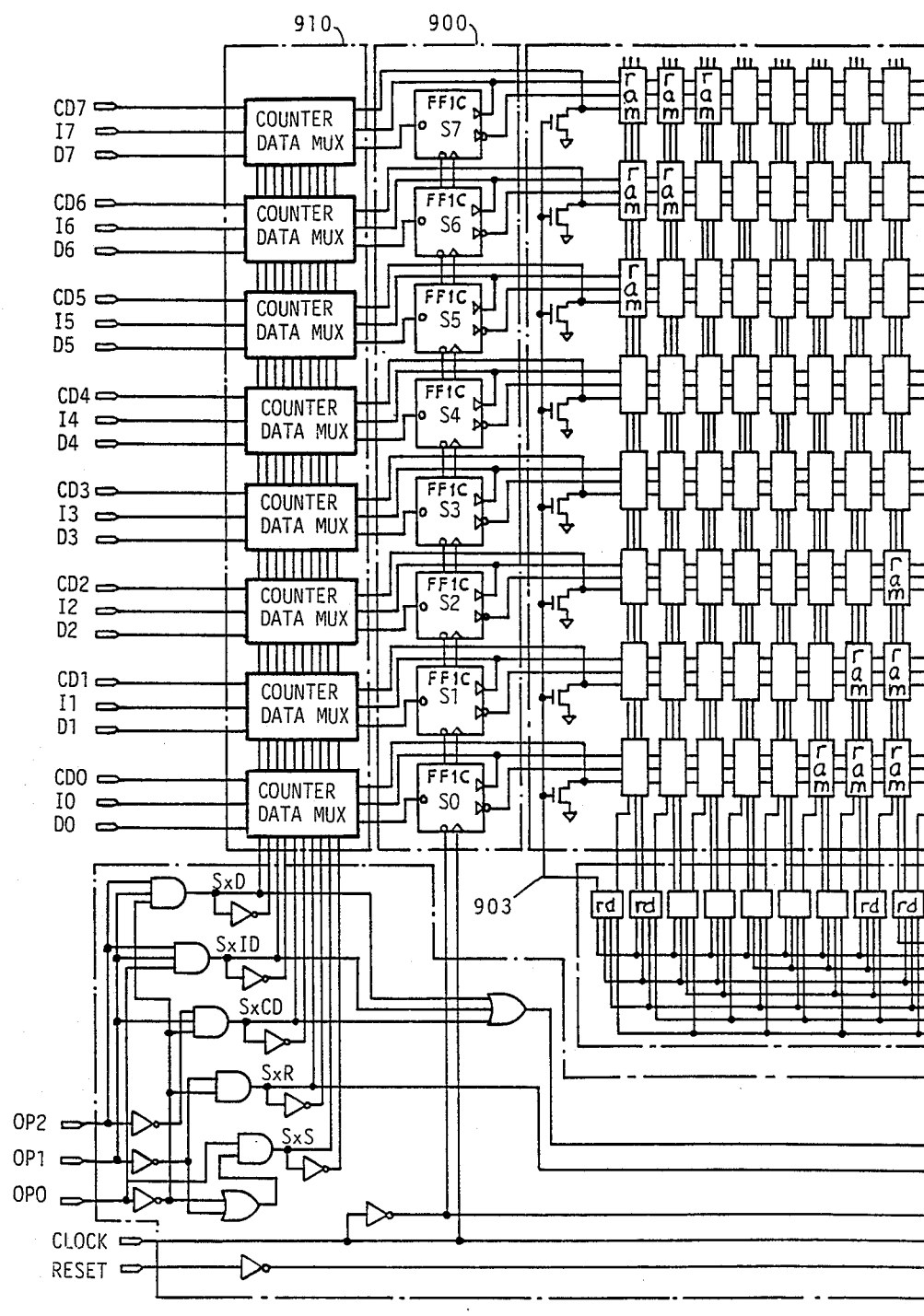
FIG. 9 (LEFT)

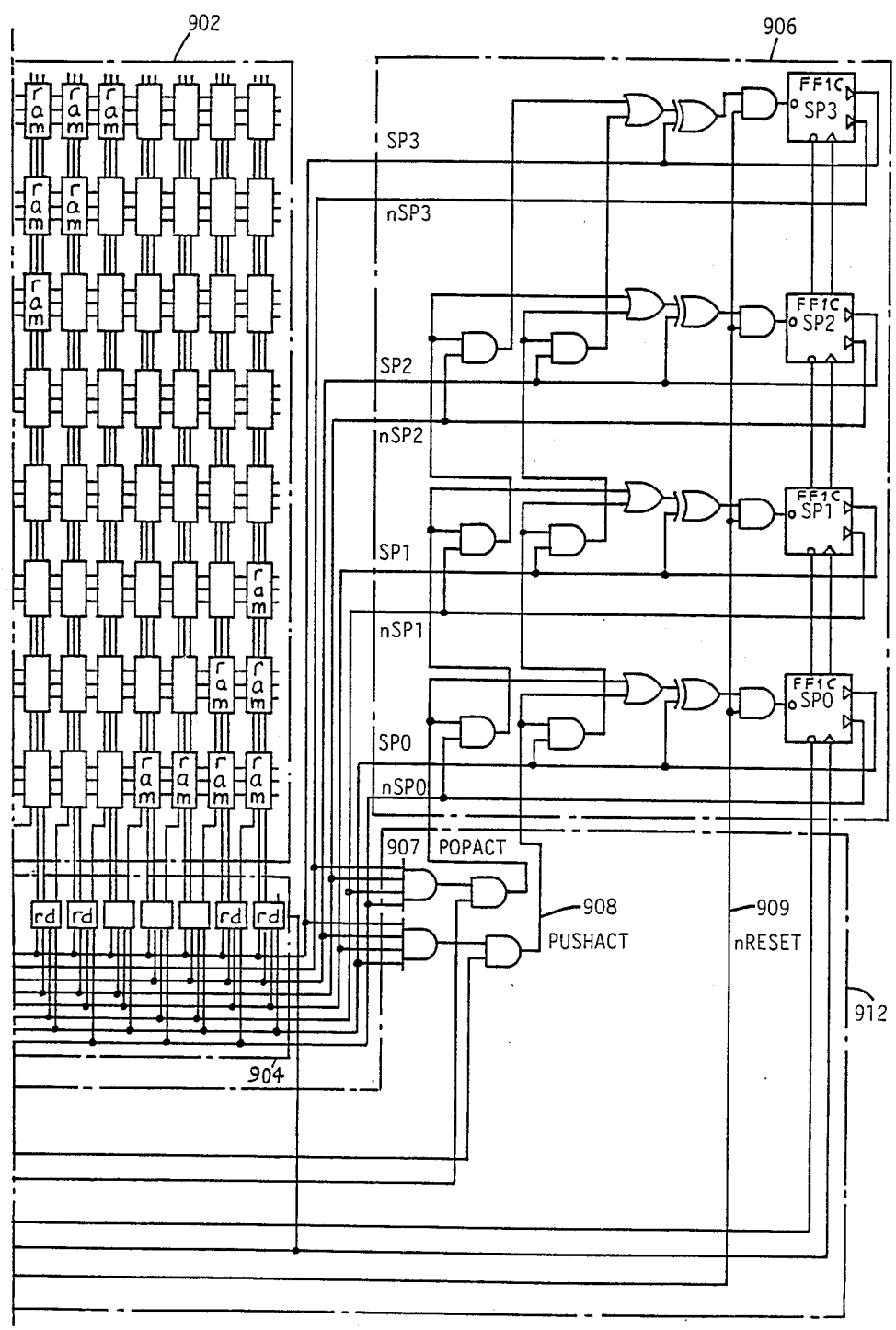
FIG 9 (RIGHT)

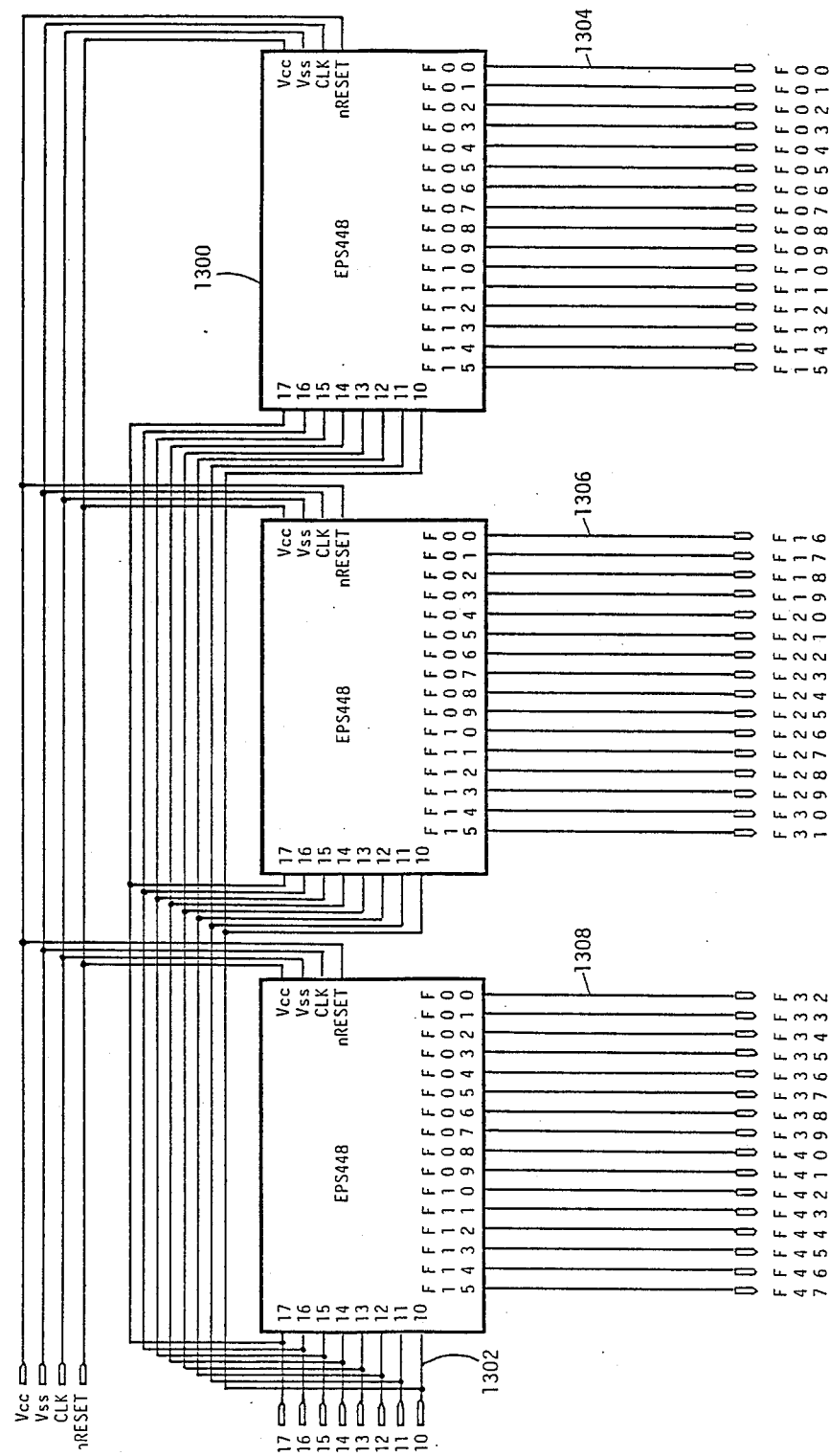
FIG. 13  Horizontal Cascade

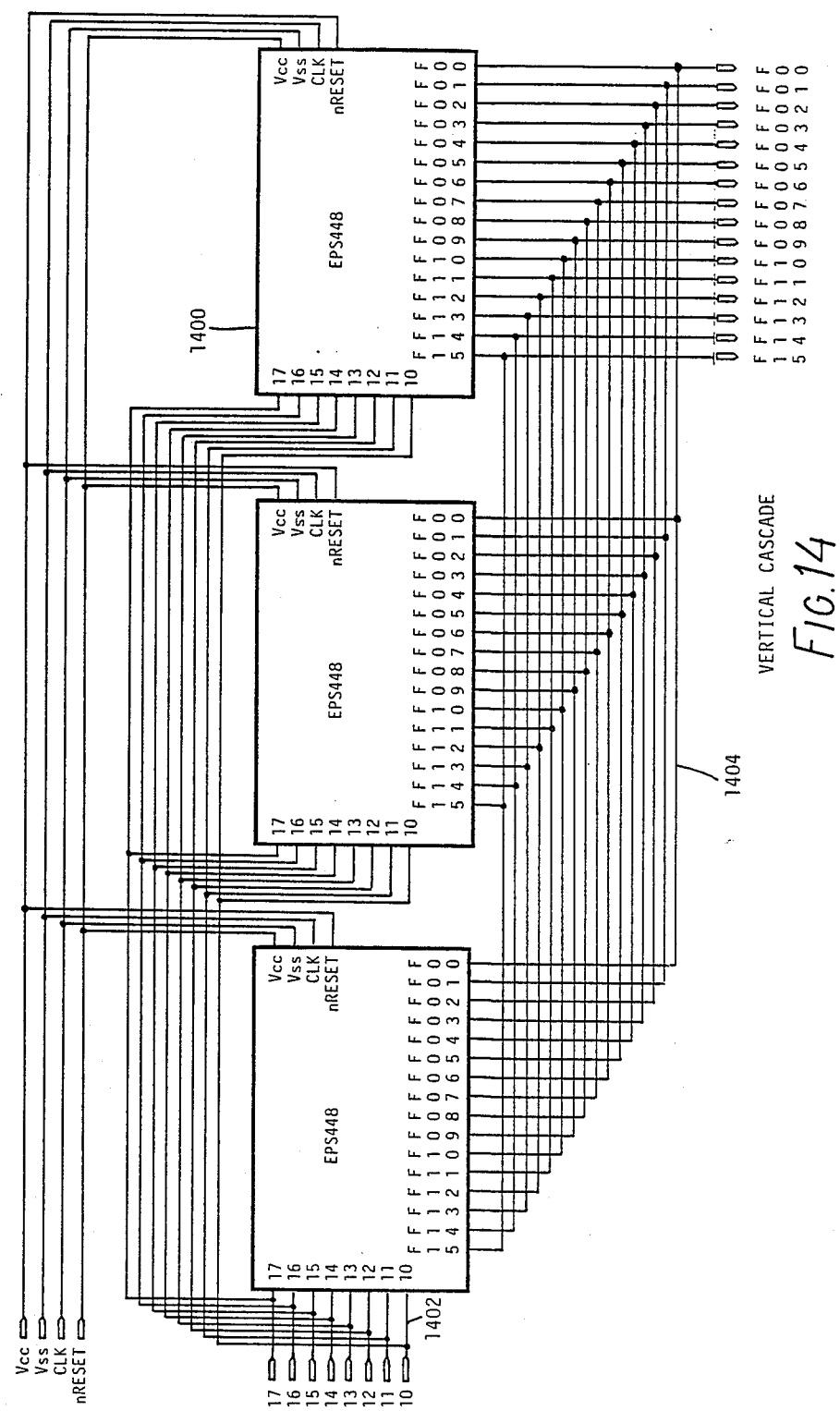
FIG. 14 VERTICAL CASCADE

PROGRAMMABLE INTEGRATED CIRCUIT MICRO-SEQUENCER DEVICE

BACKGROUND OF THE INVENTION

1. Field of the Invention

The present invention relates generally to programmable logic devices, logic sequencers and microprogram controllers/sequencers and more particularly to an improved family of fully integrated CMOS VLSI micro-sequencer devices which provide an efficient means for implementing state machines and microcoded controller devices.

2. Discussion of the Prior Art

Currently available microprogram sequencer parts offer relatively high speed control blocks for microprogrammed machines. Many of these parts are not programmable, so only a fixed architecture is available to the user. Non-programmable parts can only provide a microcode address output, which then drives the address port of an additional EPROM chip. The result is a lower speed of operation, and a minimum of two chips for operation: a microprogram address sequence generator and a code ROM.

Other available micro-sequencers are once programmable (through fuses), resulting in a higher potential operating speed since all delay paths are contained in one chip. Such fuse based devices are not reprogrammable and generally consume such large amounts of current that the total number of programmable elements per chip is limited by thermal considerations.

Another observation about existing micro-sequencers is that the conditional branching capability is (apparently for reasons of speed) rudimentary. Branching between two different "next address" possibilities is supported, but the decision is based on the logic value of only one input signal, or at most a single programmable AND or OR term. This limited branching capability often causes considerable inconvenience to the use of these parts.

Microprogram sequencers such as the AM2909, AM2911 and AM2910 all from Advanced Micro Devices (AMD) are used to control the sequential execution of microcoded operations in so called "bit slice" computers. These devices provide a microcode address each clock, which address is used to access an external program memory. The outputs of the external program memory control the various components of the bit slice processor. Microprogram address branching in these parts is rudimentary, consisting of a test of the OR of two input pins. In any given clock cycle there are only two possible choices for the next address, the default if the OR is true and a single alternative if the OR is false. A later part from AMD, the AM29PL141 slightly extends this by making the branching decision based on as many as seven input signals, but the decision is still limited to one default address and a single alternative address. A common limitation among the AM2909, AM2911 and AM2910 is the need for an external microcode memory. This limitation is relieved in the AM29PL141 where a small program memory is included on the same chip as the address sequencer.

The logic sequencer is a more general purpose component which is not specialized to the task of microprogram control.

In FIG. 1 a logic sequencer block diagram is shown. This block diagram reflects the current state of the art in logic sequencers. In this diagram there is a clocked pipeline register 100 which receives inputs from the AND/OR logic array 102 and delivers synchronized output data to lines 104 to drive the output pins 108, tristate enable lines 106 for same, and a number of internal feedback lines 110 into the AND/OR array 102. Also driving inputs to the AND/OR array are signals from the external pins 112. The pipeline register 100 is clocked by a signal named CLOCK 114 which comes from an external pin. Such a figure appears in the U.S. Pat. No. 3,566,153 to R. F. Spencer of Texas Instruments (1971). The use of tri-state output control of output drivers is well known in the art.

A circuit typically used to implement the AND/OR logic array 102 of FIG. 1 is shown in an EPROM implementation in FIG. 2. This figure is similar to one found in the U.S. Pat. No. 4,617,479 to R. F. Hartmann et al of Altera (1986). In FIG. 2 the EPROM transistors 220 are programmed by a-means not shown, so that some of the transistors will never conduct whether the gate voltage is zero or +V. Although the cells including the transistors 220 are reprogrammable using techniques well known in the art, they are not reprogrammable during logic function operation of the device. Unprogrammed transistors will conduct when their gates are driven to +V, but not when driven to zero volts. The major elements of FIG. 2 are the input signal circuits 200 which drive the first level of programmable NOR circuits 202 (which perform a programmable negative logic AND function) which in turn drive the second level of NOR gates 204 (which perform a programmable positive logic OR function) which then drive the output signal lines 206. This functional block is universal in the sense that any logic function may be expressed in a "sum of products" form, which means the OR function of some number of AND functions of the input signals. In practice the number of AND functions which may drive the OR function will be limited in any particular implementation. Because of this, some logical functions of the input signals may not be implementable in a given device. A particular type of device, in which the AND functions are programmable, but the subsequent OR functions are not programmable is disclosed in the U.S. Pat. No. 4,124,899 to J. M. Birkner et al of Monolithic Memories Inc. (MMI) (1978).

Although programmable logic devices (PLDs) including PLA's, FPLA's and PAL's are well known in the art and are available in a variety of configurations, such devices suffer from the disadvantages that, as generally depicted in FIG. 1 of the drawings, all of the signals leading into the logic array 102 will have the same structural path through the logic block to the outputs. Therefore, the critical delay from any input to the outputs is about the same. Those skilled in the art will recognize, however, that some of the signals driving into the programmable logic block come from sources inside the chip (thus they will arrive relatively early) while others come from sources off the chip, and will therefore arrive later. For a synchronous logic sequencer this arrangement (of equal delays for early and late inputs) is suboptimal. Internal signals are "early" since they achieve their values shortly after each clock rising edge (clock-to-output-time "tco" of the internal flip-flops), while the external signals are "late" since they accumulate the tco of an external flip-flop plus the extra delay of the input pad electronics plus the delays of any additional gating which might be used. Clearly, some means of using the extra time during which the internal signals are available prior to the arrival of the external signals would enhance the overall speed of a machine.

DESIGN OBJECTIVES

An objective of the present invention is to provide in the CMOS EPROM technology a reprogrammable micro-sequencer which offers higher operating speed and lower power consumption than existing components.

Another objective of the present invention is to make use of a new technique for programmable logic devices in which some inputs have extremely short critical delay paths to the plurality of output signals at the expense of forcing other input signals to have a somewhat longer critical delay path to the same plurality of outputs. The new circuit techniques are called Dynamically Programmed Logic Device (DPLD) and Look-up Table Programmed Logic Device (LTPLD).

Another objective of the present invention is to embody a significantly more general microcode address branching mechanism with a novel structure to permit very high speed operation as well.

Another objective of the present invention is to include sufficient architectural flexibility so that microsequencer designs and high performance finite state machine designs may be implemented.

Another objective of the present invention is to provide for the cascading of multiple copies of the preferred embodiment, both vertically and horizontally, to permit designs of very great complexity to be implemented. Horizontal cascading is given to mean that a larger number of output signals will be supported than inherent to the single device; vertical cascading is given to mean a means of increasing the depth of the microcode (increased number of lines of code) by use of multiple units.

Another objective of the present invention, as specifically regards the reloadable loop counter, is to provide a more useful set of end conditions and means of detecting these end conditions so that more sophisticated loop control is made available to the user of this component.

SUMMARY OF THE INVENTION

Briefly, the present preferred embodiment of the present invention includes a dynamically programmable logic device (DPLD) combine with an EPROM look-up table to form a novel look-up table programmable logic device (LTPLD) which is combined with a register to form a stand alone micro-sequencer (SAM) that may be used to implement state machines and micro-coded controller devices. The usefulness of the present invention is further expanded by the addition, in various other embodiments, of code look-up tables, priority encoders, multiplexors, stacks and counters and all associated control circuits.

The DPLD is shown to form the basis of a hardware technique for factoring canonical AND/OR logic expressions to optimize critical timing delay paths in programmable logic devices.

ADVANTAGES OF THE PRESENT INVENTION

An important advantage of the present invention is that a technique is provided wherein multiway conditional branching is supported; as compared to the two way conditional branching of previous designs. In the preferred embodiment four way conditional branching is supported, with the decision based on a complex logic function of both the internal state and the values of the eight input signals. The programmed AND/OR logic function is evaluated in less than half of the operation clock cycle time of the part; this allows the full speed potential of the part to be utilized in an application. Furthermore, the conditional branching decision is prioritized, so that only the highest priority case (among the cases whose predicates evaluate true) will be selected. The use of priority encoding reduces the complexity of the AND/OR expressions required in the branch selection predicates.

Another advantage of the present invention is the use of the novel LTPLD structure to implement high speed programmable AND/OR logic. This structure allows the two classes of inputs to the AND/OR logic ("early" and "late") to pursue different critical delay paths. In this way an inherent difference in the time at which the two classes of signals last settle (to their final values) may be exploited. The earlier arriving signals follow a path through the EPROM to the predicate definition lines of the LTPLD, while the later arriving set of signals drive the remaining inputs to the LTPLD. The delay path from the second plurality of inputs to the outputs of the LTPLD is much smaller than the delay through an EPLD with an equal number of outputs and product terms.

Another advantage of the present invention is the use of CMOS EPROM technology in the preferred embodiment. This permits high speed and low power dissipation.

Another advantage of the present invention is the fact that the output signals of a given device are tri-stateable. This allows a different device to drive the same signal lines. Making use of this capability, it is possible to cascade several of the devices of the present invention in a vertical fashion. In a vertical cascade only one of the devices drives the outputs at a time. All devices receive the same set of input signals, the same nRESET signal and the same CLOCK signal. Each device contains a number of active states and some number of "sleeper states." When a particular device is in a sleeper state, it tri-states its outputs. When it is active it drives the outputs. Sequencers with several times as many microcode lines as any single device contains may be constructed in this way.

Another advantage of the present invention is that devices in accordance with the present invention may be horizontally cascaded to achieve a multiple of the number of outputs which an individual device provides. All of the microcode in each individual device is identical except for the output field. This field is different in each of the individual devices.

Another advantage of the present invention is the form of the counter. Since during each clock cycle the data entering into the counter register is checked to see if it is zero, and this information is stored in a flip-flop at the same time as the counter register is loaded (i.e., the rising edge of the clock signal), no additional time must be spent to determine this condition. When a decrement order is received (from the decode of an opcode) the counter control logic first determines if the counter is already at zero. If it is already at zero, the decrement is inhibited. In this way the counter never "rolls over." This feature is particularly useful in microcode which uses nested subroutines, since "counter equals zero" is often an exit condition. Several tests of the counter (using the opcode for decrement and branch on non-zero) will return the same answer in succession. Both the pipelined detection of counter equals zero add the fact that the down count saturates at zero are significant advantages to the user of the part.

IN THE DRAWING

FIG. 3A and 3a illustrates the combination of the DPLD of FIG. 3 and an EPROM to make an LTPLD in accordance with the present invention, which is sufficient to implement the same logic function as the EPLD of FIG. 2;

FIG. 3B and 3b illustrates the combination of the DPLD and a register and an EPROM sufficient to implement the same logic function as the EPLD of FIG. 2 but with a delay of one clock introduced in the path from the early signals;

Figure 8:
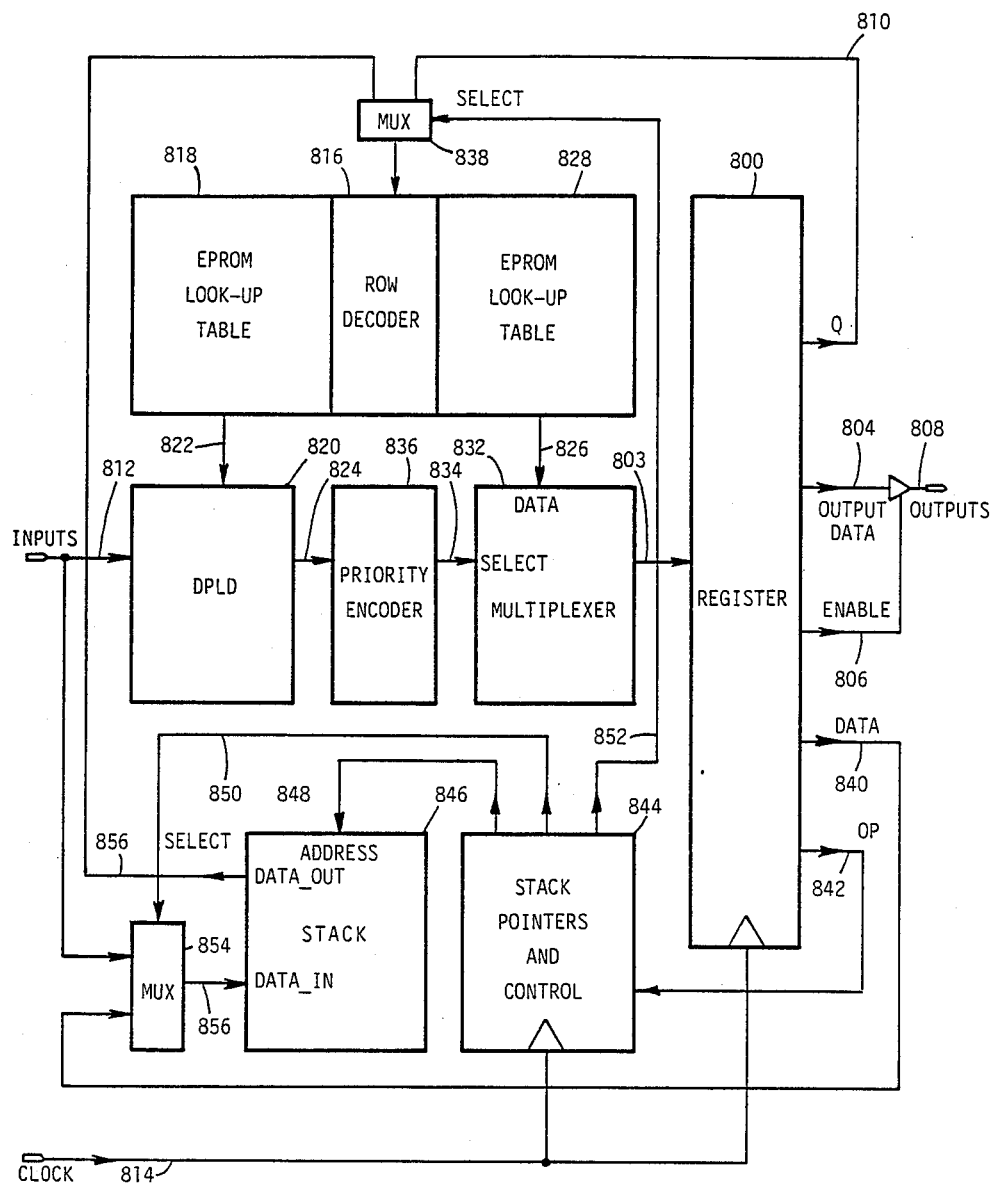
FIG. 8 is a block diagram generally illustrating another alternative embodiment of the present invention.

FIGS. 9(left) and 9(right) is a block generally illustrating in further detail the stack and stack control components of FIG. 8.

Figure 9A:
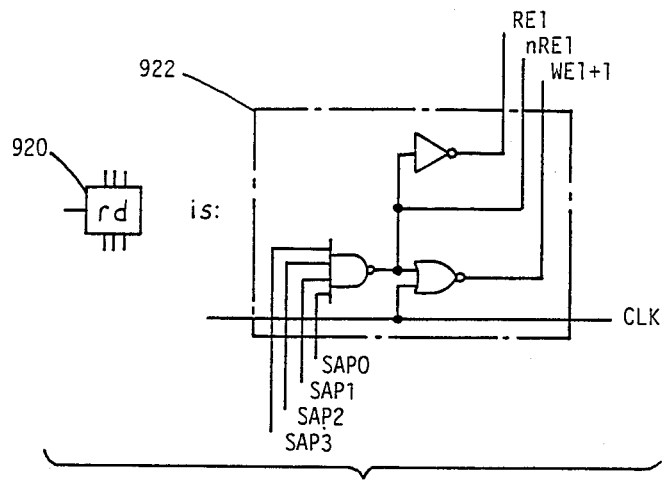
Figure 9B:
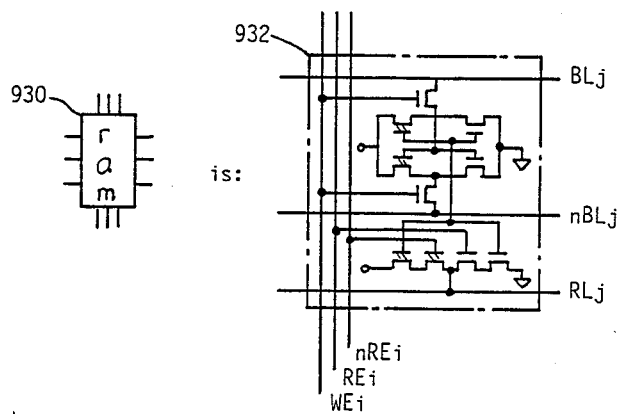
Figure 9C:
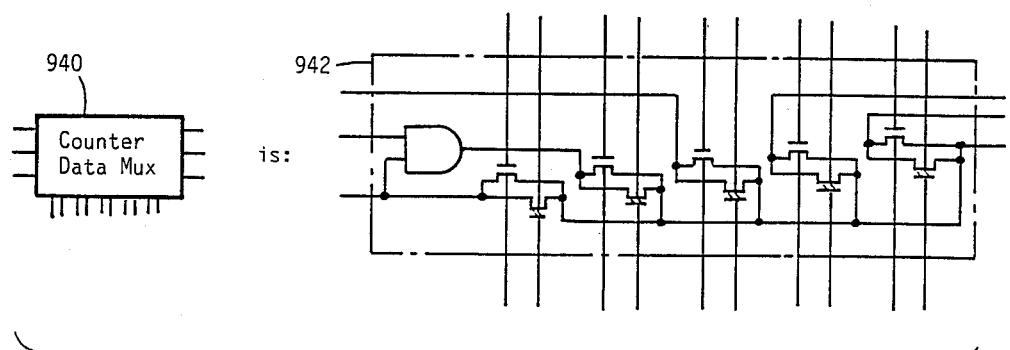
Figure 10:
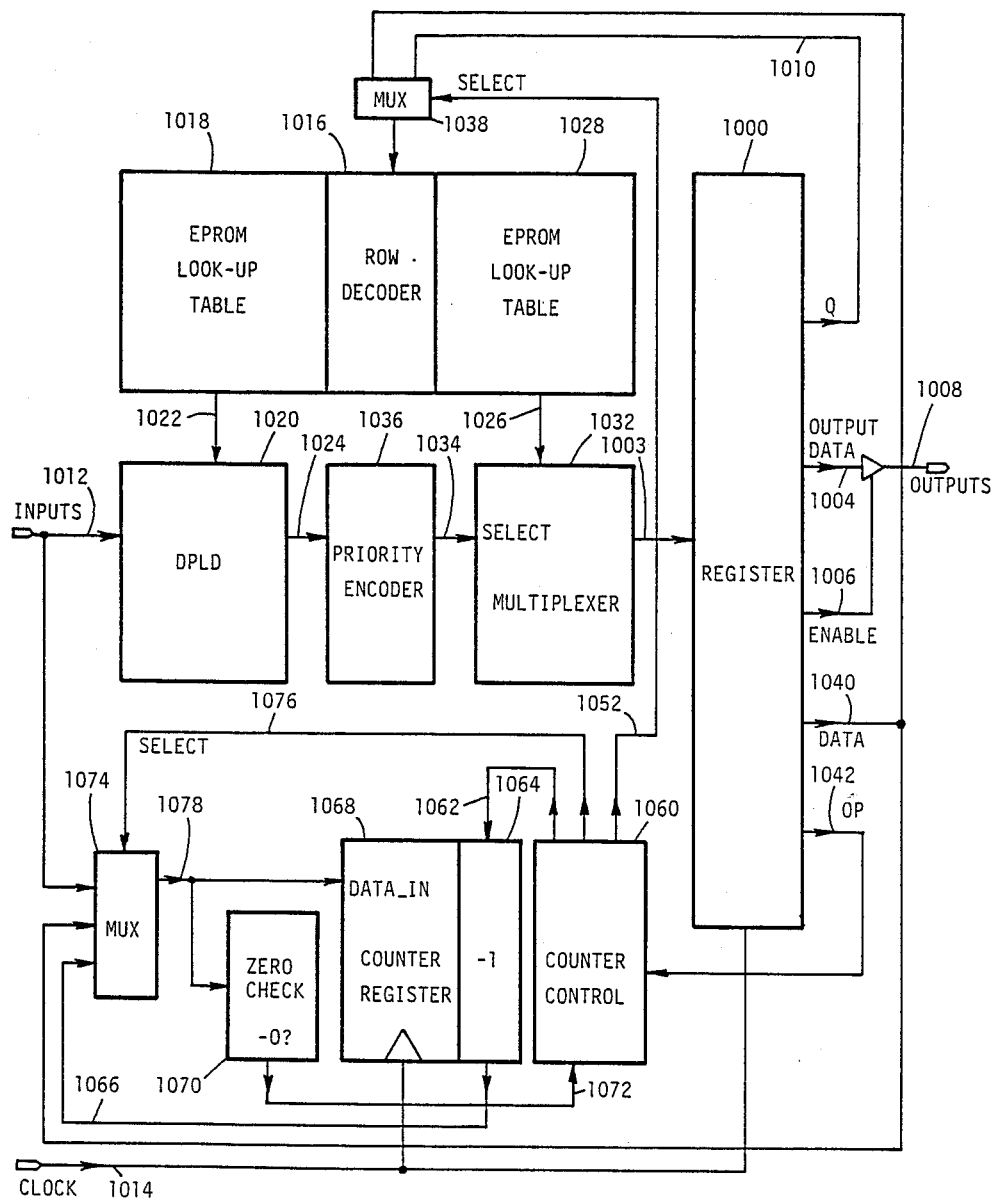
Figure 11:
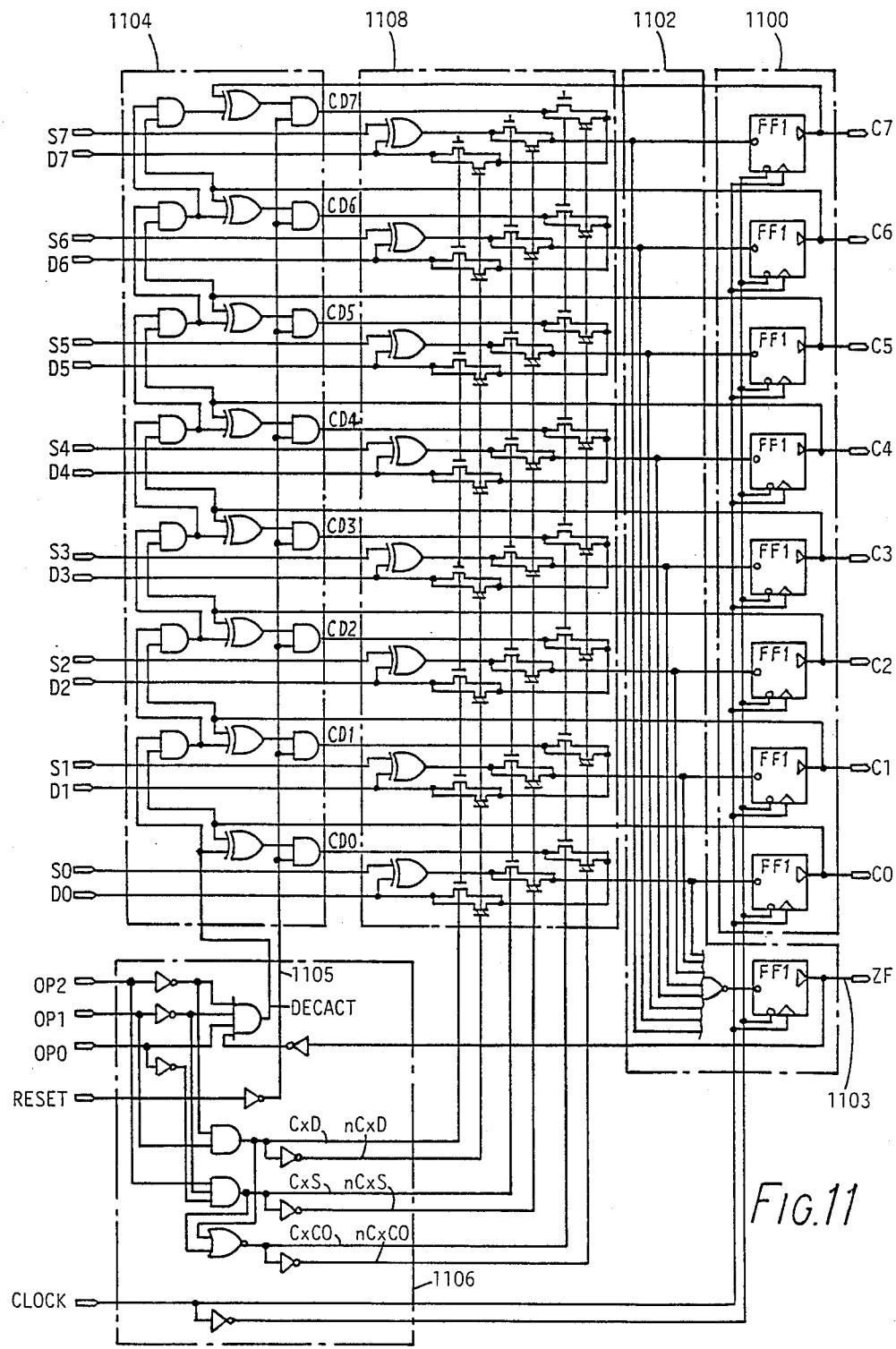
Figure 12:
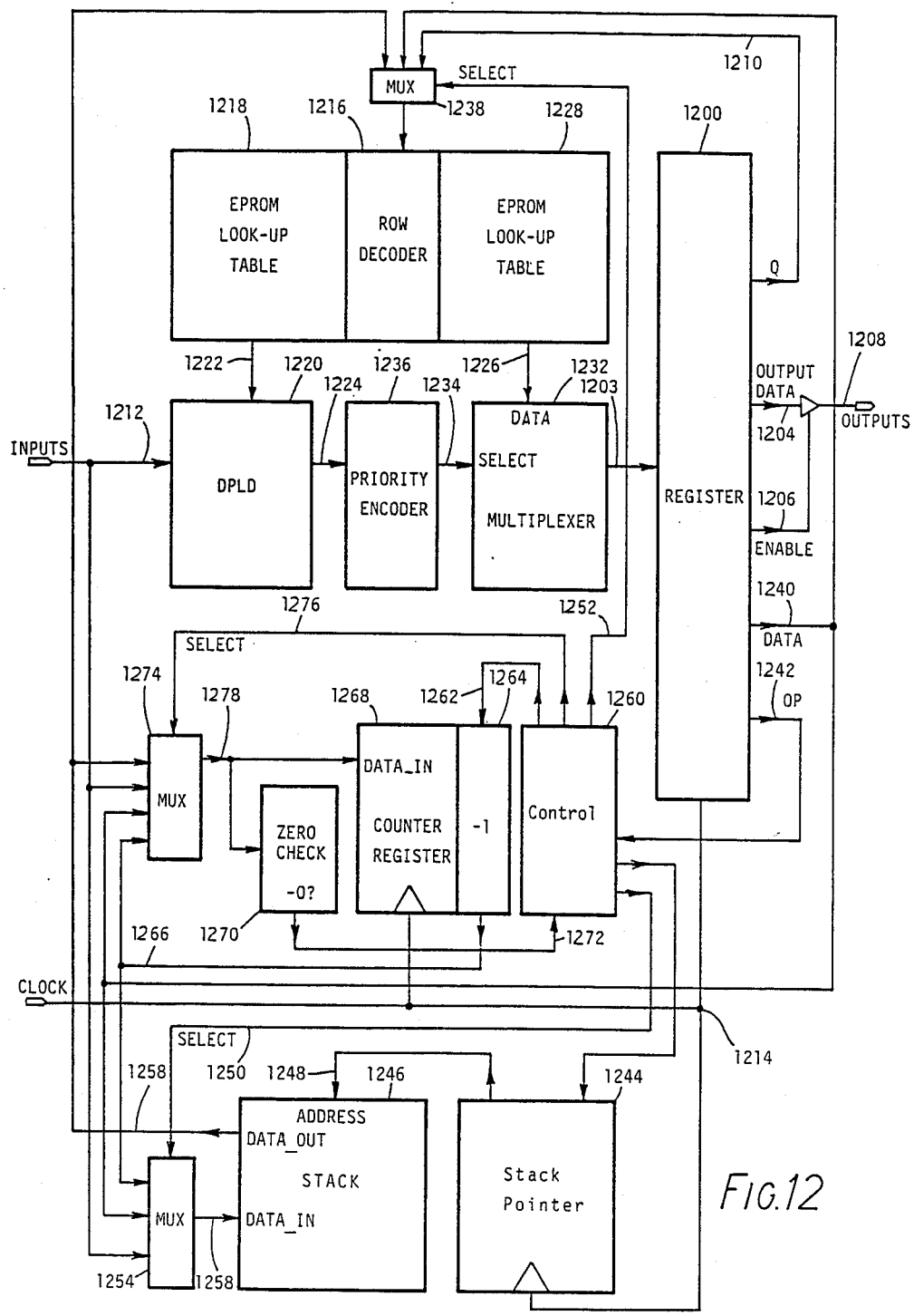

FIG. 9a, FIG. 9b and FIG. 9c further illustrate details of the circuit of FIG. 9, FIG. 10 is a block diagram generally illustrating another alternative embodiment of the present invention;

FIG. 11 is a diagram further illustrating details of the counter and associated control circuitry of FIG. 10;

FIG. 12 is a block diagram generally illustrating another embodiment of the present invention which includes all of the features shown in FIGS. 8-11;

FIG. 13 is a block diagram generally illustrating the horizontal cascading of several copies of the preferred embodiment of the present invention to achieve a greater number of output signals;

FIG. 14 is a block diagram generally illustrating the vertical cascading of several copies of the preferred embodiment of the present invention to achieve a greater depth of microcode.

DETAILED DESCRIPTION OF THE PREFERRED EMBODIMENTS

Figure 1:
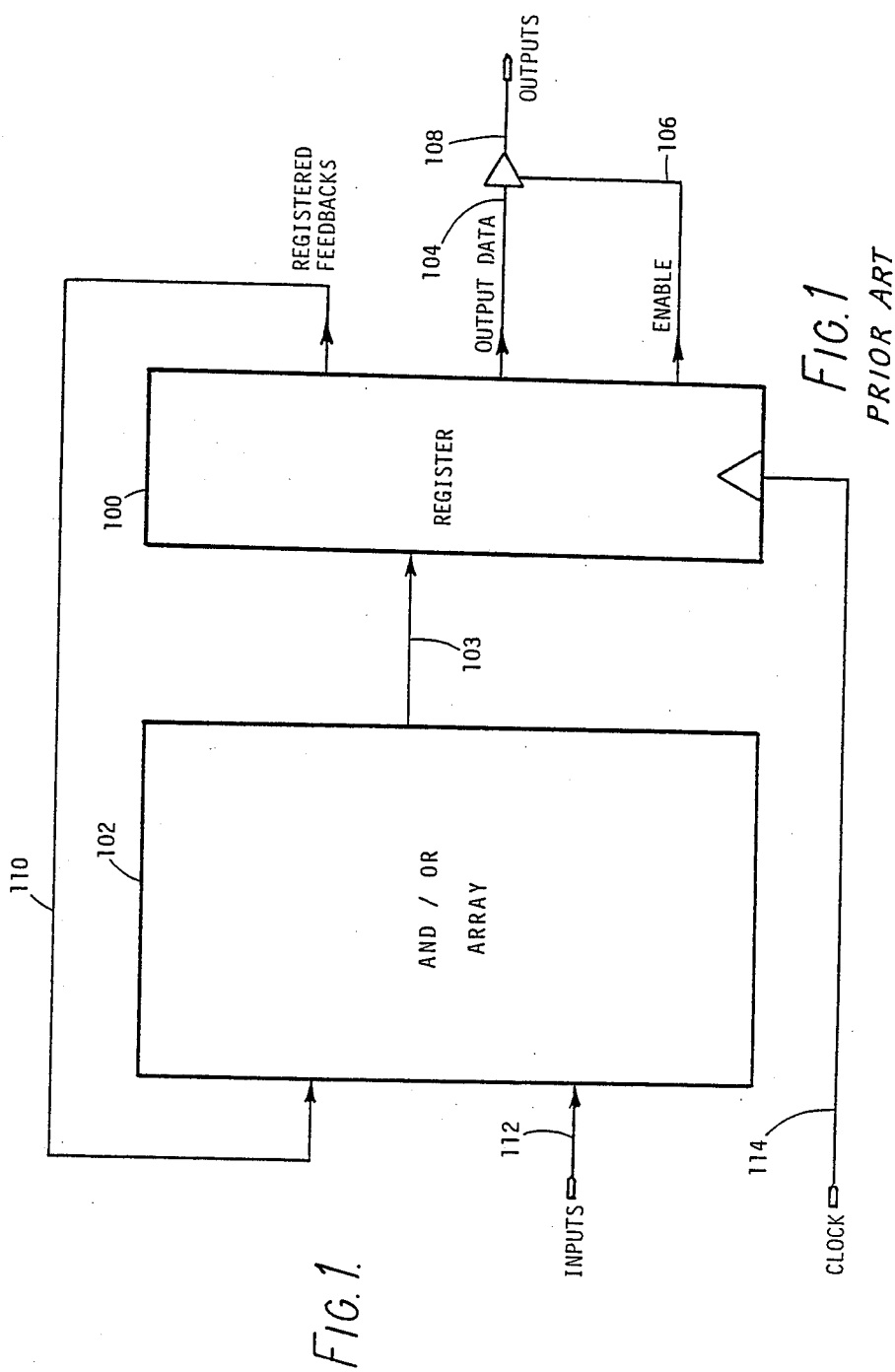
FIG. 1 is a simplified block diagram generally illustrating a prior art state machine or logic sequencer.
Figure 2:
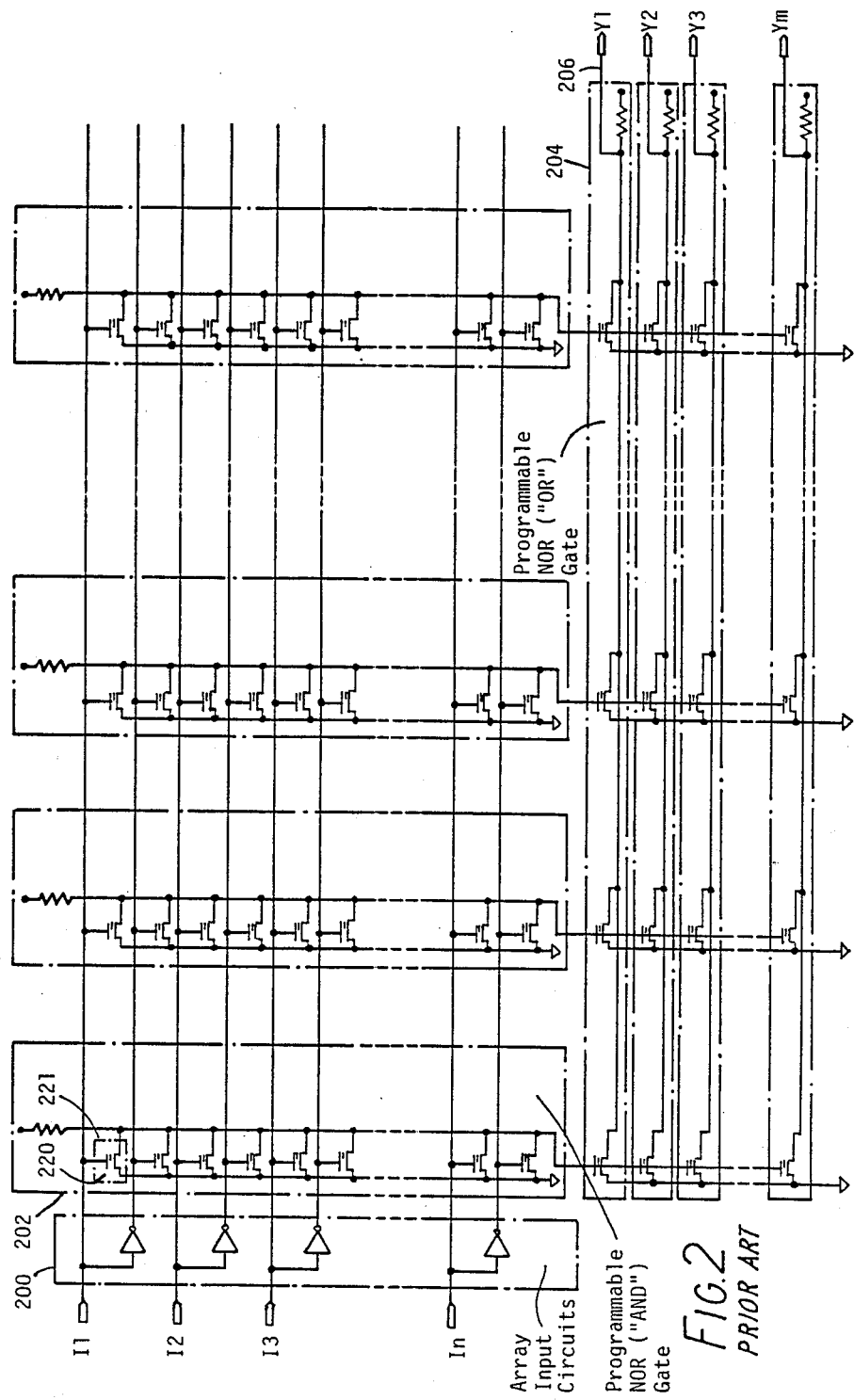
FIG. 2 illustrates an EPROM based programmable logic device as known in the prior art.
Figure 3:
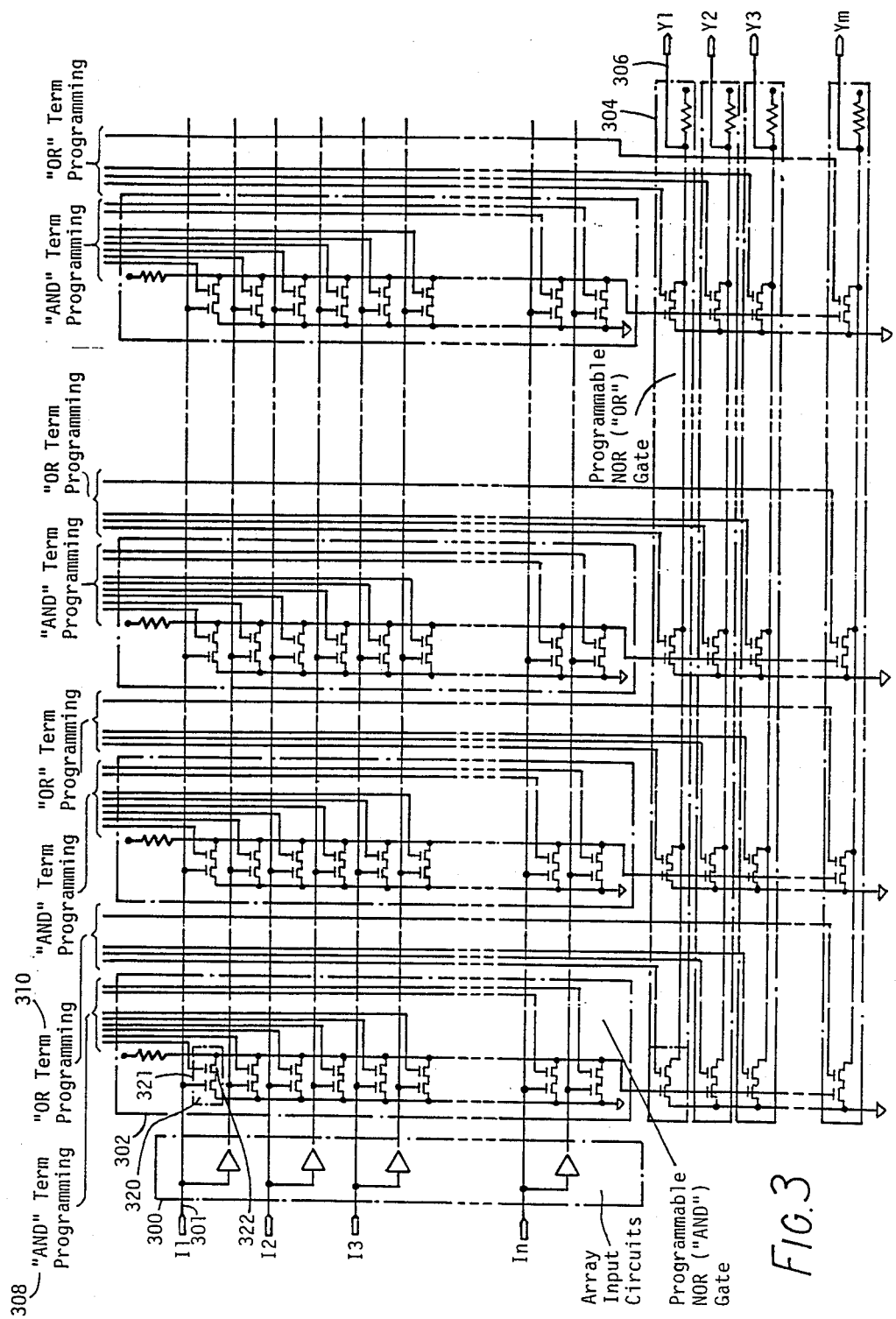
FIG. 3 illustrates a preferred embodiment of the basic dynamically programmable logic structure (DPLD) of the invention.

A preferred implementation of the basic building block of the present invention, the Dynamically Programmable Logic Device (DPLD), is generally illustrated in FIG. 3. Comparing this figure with FIG. 2. It will be noted that the EPROM transistor 220 forming each erasable programmable cell 221 of the prior art circuit has been replaced by a series connected pair of N-channel transistors 320 and 322 forming a dynamically reprogrammable cell 321. Otherwise the structure of the first NOR gates 202 and 302 are essentially the same. The series pair of transistors 321 consists of a first transistor 320 with the same gate connection as the corresponding EPROM transistor 220 in FIG. 2. The gate connection of the second transistor in 322 is connected to one of the "programming" signal inputs 308. Whereas the programming in FIG. 2 is contained in the floating gate of the EPROM transistor 220, in FIG. 3 the programming is dynamic and enters the circuit through the programming leads or terminals 308. A similar correspondence exists in the cells 324 of the second level NOR gates where the dynamic programming of the second level transistor 325 enters the DPLD through programming leads or terminals 310. The input circuits 200 and 300 and the output circuits 206 and 306 are identical in both embodiments. It will thus be appreciated that, whereas in the prior art circuit of FIG. 2, the logical function to be implemented by the circuit was predetermined when the device was programmed, the programming of the DPLD of the present invention is dynamic. That is, it can be changed and redefined as often as once during each clock cycle of operation of the device.

In FIG. 3a one possible source of the dynamic programming signals to a DPLD is illustrated. In this preferred embodiment the source is an EPROM 316 of conventional design, although other sorts of memory including, but not limited to, ROM, RAM, EEPROM, and FUSE array device, would also serve this function. The input signals IE1, IE2, IE3, ... IEp applied at 312 are the "early" signals compared to the "late signals" I1, I2, I3, ... In applied at 301 which directly drive the inputs of the DPLD. The "early" signals input at 312 drive a conventional address decoder 314 which provides one active word select into the EPROM array 316. The resulting groups of EPROM output signals on lines 308 and 310 then drive the dynamic programming signals or lines of the DPLD. The logic function expressed at the outputs 306 is thus the convolution of two functions. The first function is:

$$\text{dynamic\_programming} := F(\text{IE1, IE2, IE3, ... IEp})$$

and the second logic function is:

$$\text{outputs} := G(\text{dynamic\_programming, I1, I2, I3, ... In}).$$

Taken together:

$$\text{outputs} := GF(\text{IE1, IE2, IE3, ... IEp, I1, I2, I3, ... In}).$$

importance of separating the function GF into the two

The parts F and G is that F may be made relatively slow while G is made very fast. In this way only the delay from function G appears in the critical timing path since the early inputs are assumed to be available somewhat earlier than the late inputs.

The fundamental result is that a logic function may be factored into two logic functions in such a way that the plurality of inputs are split into two sets, one preferred in terms of critical delay, the other less preferred.

Another preferred embodiment of the present invention is generally illustrated in FIG. 3b where the dynamic programming lines from the EPROM have been intercepted by a clocked register 334. This causes the two parts of the logic function to be performed in pipelined fashion; the F function is performed in one clock cycle and the G function is performed in the next clock cycle. Pipelining is a technique well known in the art for reducing the critical delay per clock cycle in a circuit at the cost of increasing the number of clock cycles required for the first useful functional output. An important case of intermediate storage 334 (delay) in the path of the dynamic programming signals is the case where the "staging" flip-flops are actually just pass gates In this case the input capacitance of the transistor 322 is the storage capacitance.

Figure 4:
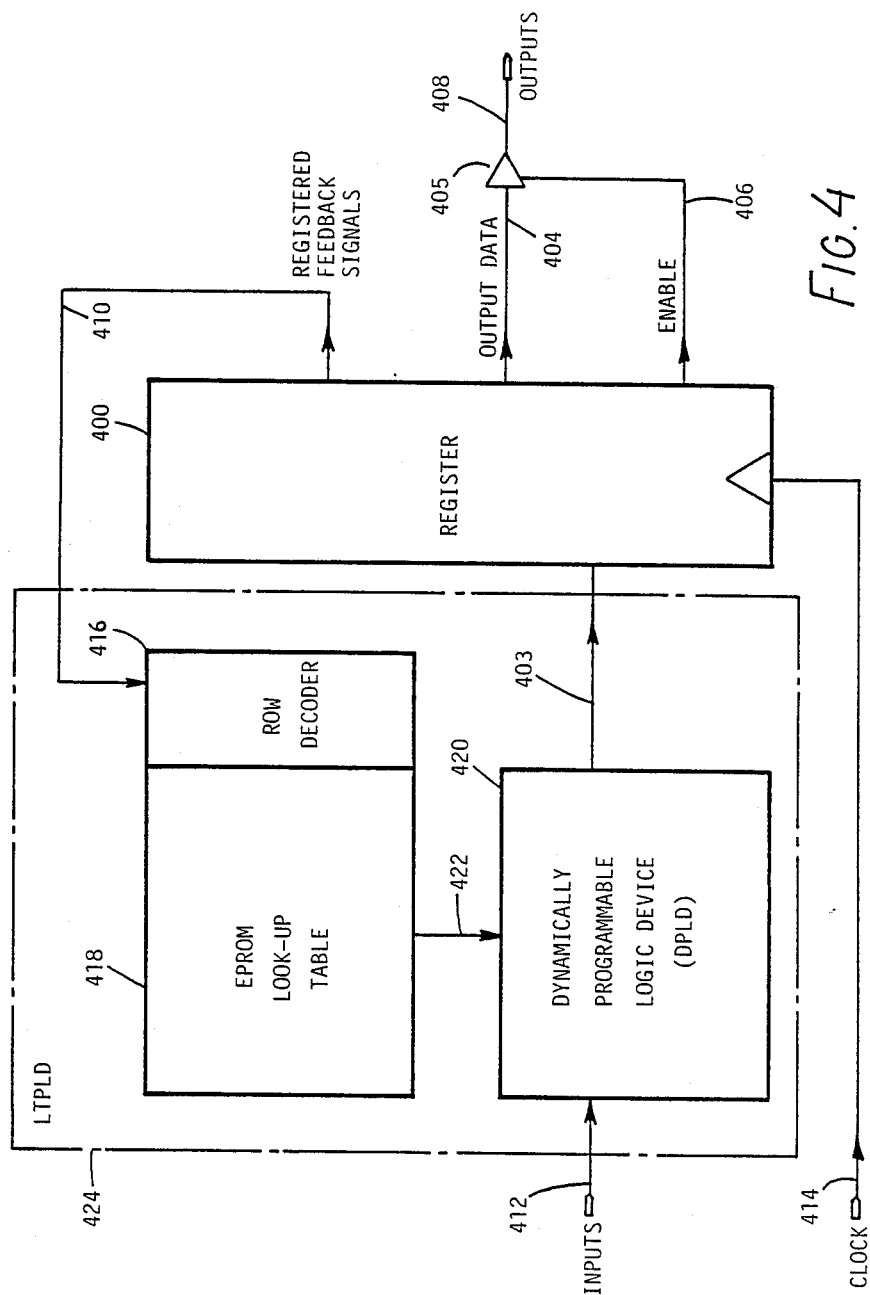
FIG. 4 is a simplified block diagram generally illustrating one embodiment of a stand alone microsequencer (SAM) device in accordance with the present invention.

Implementation of the present invention in a microsequencer device is generally illustrated in FIG. 4. As depicted, this embodiment includes a pipeline register 400 in combination with the LTPLD 424 which is comprised of a row decoder 416, EPROM look-up table 418 and dynamically programmable logic device 420 as previously shown in FIG. 3a. When the CLOCK signal input at 414 rises to start an operational cycle, this causes the data on lines 403 to be loaded into the pipeline register 400. Shortly thereafter, that data appears at the outputs 404, 406 and 410 of the pipeline register 400. The output data on lines 404 drive the output pins 408 via tri-state buffers 405 when the enable signal on line 406 is true. When the enable signal on line 406 is false, the output pins remain in a high-impedance state (regardless of the valves of the output data appearing on lines 404); such that this component does not define the output values. The registered feedback outputs on lines 410 drive the row decoder 416 which allows exactly one of 2**n word selects in the EPROM 418 to rise where "n" is the number of feedback bit-lines 410. A DPLD programming word is accessed in the EPROM to drive the dynamic programming lines 422 (lines 308 and 310 of FIGS. 3 and 3a) of the DPLD 420. The preferred delay inputs ("early" inputs) to the DPLD come from the input pins 412.

Figure 5:
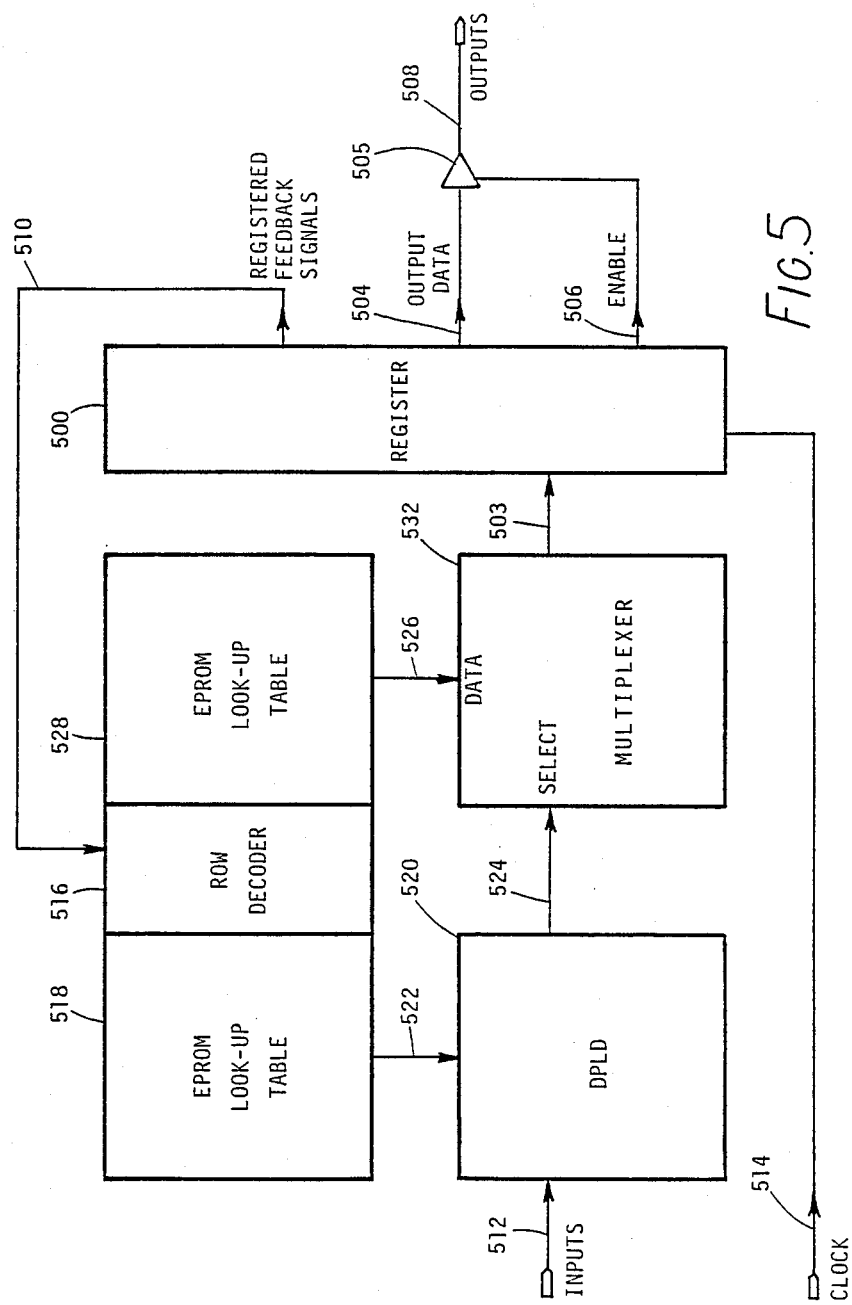
FIG. 5 is a block diagram generally illustrating another alternative embodiment of the present invention.

Another preferred implementation of the present invention is generally illustrated in FIG. 5. In this implementation a second EPROM 528 has been added which shares a common address (row) decoder 516 with the previously described EPROM 518 (which is the same as 418 in FIG. 4). A multiplexor 532 has also been interposed in the path between the DPLD 520 and the pipeline register 500. The function of the multiplexor is as follows. The outputs of the DPLD 520 are taken to be the select controls 524 of the multiplexor 532. The selection is made among several data fields 526 which issue from the "code" EPROM 528. The selected data is output from the multiplexor 532 on lines 503 and proceeds to the inputs of the pipeline register 500 into which it is latched on the rising edge of CLOCK 514. Please note that from time to time the CLOCK signal will be abbreviated herein as CLK. The incremental advantage of this approach is that the number of signals issuing from the DPLD 520 is now the relatively small number of signals (on lines 524) required to make the selection at the multiplexor 532. Since a disadvantage of the DPLD is its increased power consumption per AND term (302 of FIG. 3) and per OR term (304 of FIG. 3), a reduction in the number of required outputs (306 in FIG. 3) limits the power consumption cost of the DPLD. It is worth noting that some sacrifice in operating speed is experienced in the embodiment of FIG. 5 as compared to FIG. 4. This is due to the additional signal delay experienced in passing through the multiplexor block 532. The magnitude of this incremental delay is relatively small, however.

Figure 6:
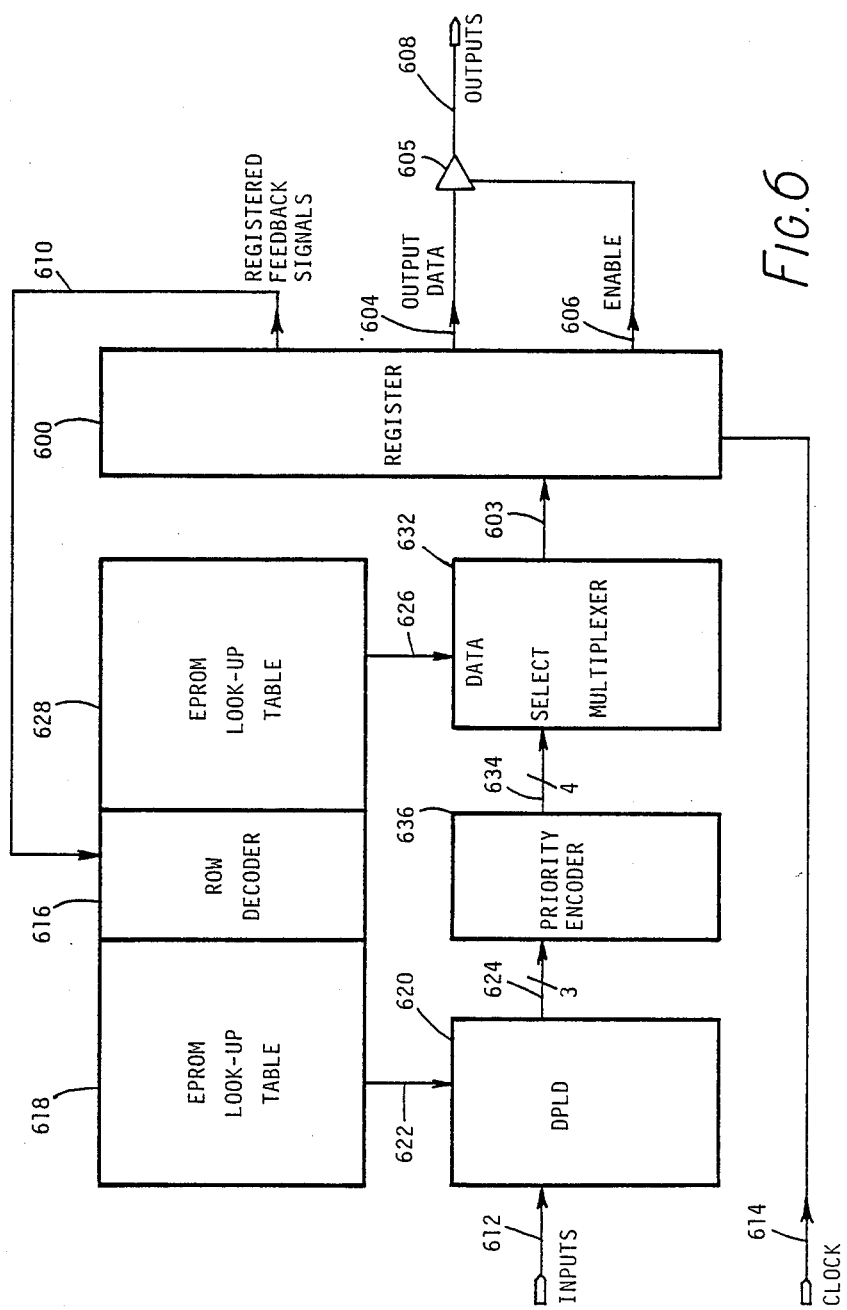
FIG. 6 is a block diagram generally illustrating another alternative embodiment of the present invention.

Another preferred implementation of the present invention is generally illustrated in FIG. 6. This implementation builds upon the implementation of FIG. 5 with the addition of a priority encoder 636 disposed in the signal path from the DPLD 620 to the multiplexor 632. The negative impact of introducing the priority encoder 636 into this path is a slight increase in the delay from the inputs 612 to the setup of the pipeline register 600. The positive impact of this is to significantly enhance the usefulness of the device. Those skilled in the art will recognize that the term "setup" refers to the required time of stability of the input to a register prior to the rising edge of the next clock to that register.

Figure 7:
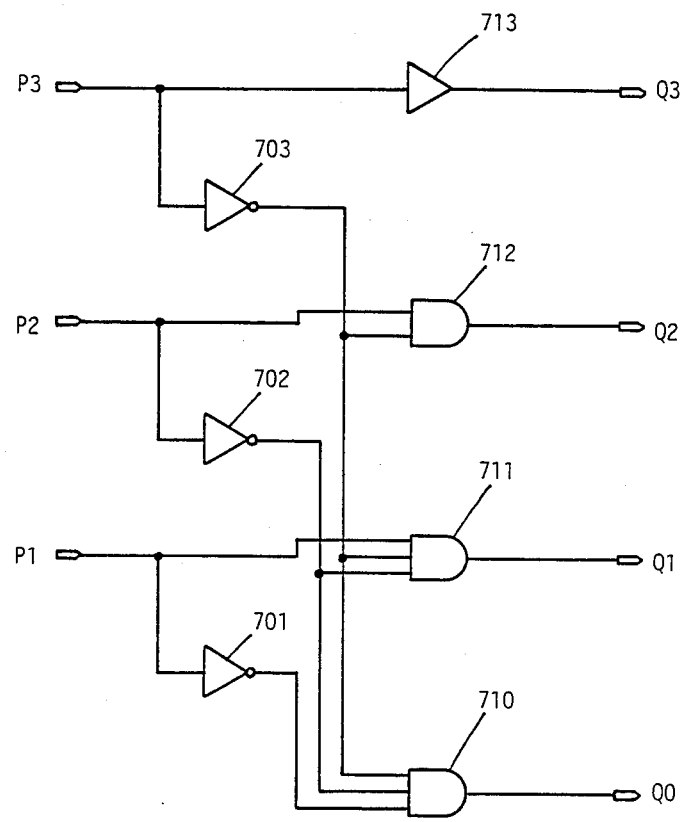
FIG. 7 is a diagram generally illustrating the logical function of the priority encoder shown in FIG. 6.

The priority encoder logic function is detailed in FIG. 7 and is described by the following truth table:

| P3 | P2 | P1 | Q3 | Q2 | Q1 | Q0 |
|----|----|----|----|----|----|----|
| -- | -- | -- | >> | >> | >> | >> |
| 1  | x  | x  | 1  | 0  | 0  | 0  |
| 0  | 1  | x  | 0  | 1  | 0  | 0  |
| 0  | 0  | 1  | 0  | 0  | 1  | 0  |
| 0  | 0  | 0  | 0  | 0  | 0  | 1  | where a "1" represents a true value, a "0" represents a false independent variables P3, P2 and P1 represent the three logic functions which drive the priority encoder via lines 624. Signals Q3, Q2, Q1 and Q0 (which are the dependent variables) represent the four outputs of the priority encoder on lines 634. The "else" case Q0 corresponds to the situation where none of P3, P2, or P1 are true.

Most expert users of integrated circuits are also software programmers to some extent. When it comes to IF THEN ELSE type expressions, the natural way in which hardware and software behave is inherently different. In hardware, all of the logical expressions (predicates) are evaluated at once, in parallel; while in software, the predicates are evaluated one at a time in the order in which the predicates are encountered in lines of the program. In order to design multi-way branching capability into a hardware design, one of these approaches must be chosen; it is impossible to do both. In other words, if the design intent is:

IF p3 THEN GOTO label_q3;
IF p2 THEN GOTO label_q2;
IF p1 THEN GOTO label_q1;
GOTO label_q0;

when expressed in the linear method of a software program, then the hardware must implement:

| CHOOSE ONE OF: | |
|---|---|
| p3 | THEN GOTO label_q3 |
| not(p3) and p2 | THEN GOTO label_q2 |
| not(p3) and not(p2) and p1 | THEN GOTO label_q1 |
| not(p3) and not(p2) and not(p1) | THEN GOTO label_q0; |

The alternative (which is the prior state of the art) is to require that the predicates p3, p2 and p1 be disjoint; that is to say that no more than one of these predicates may be true at any one time. The user support software must ensure that this is the case if the programmed device is to function properly.

In contrast, the present invention solves the same problem by automatically choosing to GOTO label_q3 if p3 is true, to GOTO label_q2 only if p2 is true but p3 is false, to GOTO label_q1 only if p3 is false and p2 is false and p1 is true, and to GOTO label_q0 only if all three of p3, p2 and p1 are false. This is accomplished by the use of a "priority encoder" logic block comprised of circuitry as shown in FIG. 7.

The hardware solution allows the user support software to be straight-forward while providing the user with the familiar structures of programming language IF THEN ELSE structures in the design capture software system.

Another preferred implementation of the current invention is generally illustrated in FIG. 8 wherein to the core shown in FIG. 6, a Stack mechanism 846 has been added along with the required control functions 844. In this embodiment two new fields appear in the outputs of the pipeline register 800; these are Data on lines 840 and OP on lines 842. The OP field 842 provides instructions to the stack such as "push" and "pop." Those familiar with the art will understand the fundamental operation of a last-in-first-out (LIFO) stack. In the standard implementation of a stack the "push" operation increments the stack pointer and then stores a data value into the top of stack. In the standard implementation of a stack the "pop" operation reads a data value from the top of stack and then decrements the stack pointer. The usefulness of the basic core from FIG. 6 is enhanced by the addition of the stack mechanism because it is now possible to have subroutines in the logic sequence. The way this is done is exactly the same as subroutining in a microprocessor. A subroutine is initiated by a CALL instruction (OP=110). The address of the next inline instruction is pushed onto the top of the stack and the address of the first instruction of the subroutine becomes the active address. When the subroutine has done its work, a RETURN (OP=000) instruction will be executed. This instruction will pop the top-of-stack for use as the next address. When a RETURN instruction is executed, the select line 852, which comes from the control block 844 and drives the microaddress MUX 838, becomes true. This causes the MUX to deliver the top-of-stack value on lines 858 for the microaddress which drives the row decoder 816. If the OP is other than 000, then the select signal on lines 852 remains false and the microaddress passed through the MUX 838 is the Q field on lines 810 from the pipeline register 800.

In software programming the use of subroutines for frequently used portions of programs reduces the size of the program and makes it easier to maintain. In a logic sequencer the same benefits are achieved. Furthermore, since the available memory size in a single chip logic sequencer is clearly limited, the use of subroutines to minimize the memory usage is a significant factor in the usefulness of this invention.

As shown in FIG. 9, the stack implemented in the present invention provides the same functionality as the prior art stack, but it does so with improved circuit timing. The innovation in the present invention is the obviation of the need to increment the stack pointer before writing the pushed data onto the stack. The stack pointer 906 is a four bit synchronous up down counter. The signal PUSHACT becomes active (true) when the OP is one of 010, 110 or 111 and the current value of the stack pointer is not 5. When PUSHACT is active, the stack pointer 906 counts up by one tick. The signal POPACT becomes active (true) when the OP is either 000 or 100 and the current value of the stack pointer is not 0. When POPACT is active, the stack pointer 906 counts down by one tick. The stack pointer 906 will not count up past 15; rather it "sticks" at 15 for any further push attempts. The stack pointer 906 will also not count down below 0; rather it sticks at 0 for any further pop attempts. In this way the sequencer is protected from stack overflow (the stack pointer cannot erroneously wrap around to the bottom of the stack on a push) and stack underflow (the stack pointer cannot erroneously wrap around to the full stack position on a pop from an empty stack.) A pop from an empty stack (stack pointer=0) will always return a value of 0 since the N-channel transistors gated by signal 903 which is the read select signal active when the stack is empty (stack pointer=0.) Address 0 happens to be the micro-sequence address of the boot state or initial power-on state. A pop from an empty stack, which is a fault, will cause the sequencer to behave as if it had been reset. A push to a full stack is also a fault. In this case the stack of the present invention will overwrite the value on the top of the stack, but will not disturb the values below this one on the stack. On the second pop following the fault, the sequencer will recapture the lost trail of subroutine return addresses. This is not always an adequate recovery, but it is predictable and will be adequate in many cases.

In FIG. 9 the top of stack register 900 is fed from a data multiplexor 910 which corresponds to 854 in FIG. 8. There are five possible data sources for the stack as shown in FIG. 9. Viewed as a component of FIG. 8, the inputs CD7, CD6, ... CD0 should be ignored. Two other sources of data are internal to the stack 846 as viewed in FIG. 8; these are the current top of stack and the next-to-the-top-of-stack. The other data sources are from the input pins 812 of FIG. 8 and the data field on lines 840 of the pipeline register 800.

Again considering FIG. 9, there is a control unit 912 for the stack and stack pointer which interprets the OP field (842 in FIG. 8), buffers the clock and reset signals, and generates the select signals for the data multiplexor 910 and the POPACT and PUSHACT signals which respectively decrement and increment the stack pointer 906. The values in the stack which are below the top of stack are held in the stack RAM file 902. The stack RAM file receives sixteen positive read select signals (exactly one is true at a time), sixteen negative read select signals (exactly one is false at a time) and fifteen write select signals (no more than one is true at any time) which are decoded from the value of the stack pointer 906 by the stack address decoder 904 (which is composed o sixteen copies of 920).

The "rd" cell 920 is exploded in detail 922 as shown in FIG. 9a. It is important to note that each cell 920 points to one row of RAM cells for reading, but points to the next higher numbered row of RAM cells for writing. This is the key to the improved timing characteristics of the stack implementation of the present invention. Instead of incrementing the stack pointer, then writing the pushed data into the row of RAM cells pointed to (after the stack is incremented), the write pointer in the present invention always points one row ahead of the current value of the stack pointer. In this way the pushed data may be written immediately, and the stack pointer may be incremented concurrently, to take effect after the next clock edge. On pops, the stack pointer may be decremented concurrently with the reading of the popped value off of the stack, as is previously known in the art.

The RAM cell 930 used herein is a two port (one read port, one write port) RAM cell of the sort familiar to those skilled in the art. For convenience it has been exploded in detail 932 of FIG. 9b.

Another preferred implementation of the present invention is generally illustrated in FIG. 10. In this implementation the core of FIG. 6 is alternatively augmented by a loop counter register 1068 with a data input multiplexor 1074, a block 1064 which performs a decrement function (i.e., CD := C−1), a zero detection circuit 1070 and a control block 1060 for all of these. The improvement over the basic core of FIG. 6, which the addition of the counter mechanism provides, is the ability to do a loop of some number of steps (lines of microcode or sequence of states) a given number of times before proceeding. An example of this is found in computer arithmetic where multiplication may be performed by shift and add. The loop consisting of the shift and add steps should be repeated N times for the product of two N-bit numbers to be computed. Numerous other examples of repetitive tasks which must be performed a specific number of times before proceeding will be apparent to one skilled in the art.

The details of the blocks 1060, 1064, 1068, 1070 and 1074 as well as the signal lines interconnecting them are generally illustrated in FIG. 11. In this figure there is a control block 1106 which decodes the OP and buffers the reset and clock signals. The signal DECACT, when true, enables the decrement function 1104, in which case the outputs of the decrement block 1104 (the CD7..CD0 signals) reflect a value which is the current contents of the counter register 1100 minus one. When DECACT is false, block 1104 passes the value of the counter register 1100 without change; CD := C. The decrement block 1104 has one more control signal, nRESET, which, when active low, forces CD := 0. This serves the obvious function of clearing the counter on chip reset. A data input multiplexor 1108 is controlled by a plurality of select signals from the control block 1106. The data which may be selected include the output of the decrement block 1104, the data field (lines 1040 in FIG. 10) of the pipeline register (1000 in FIG. 10), and the value from the top-of-stack (S7 . . . S0) EXCLUSIVE-ORed with the data field on lines 1040 of FIG. 10 (although this is not used in the implementation of FIG. 10 since there is no stack in FIG. 10). A zero detection circuit 1102 monitors the output of the data selection MUX 1108 immediately before this information is loaded into the counter register 1100. The logical output of the eight input NOR gate is sampled into a flip-flop at the same time that the counter register samples the output of the data input MUX 1108. The output on line 1103 of the flip-flop in block 1102 is named ZF for zero-flag. When ZF is true, further decrementing of the counter register by block 1104 is inhibited by the DECACT generating logic in the control block 1106. This means that once the counter is decremented to zero, it is "sticky" and cannot be made to "roll over" to 255 from zero.

Returning to FIGS. 10, the zero-flag on line 1072 enters the control block 1060 where a select signal on line 1052 is generated which controls the microaddress MUX 1038. When the OP field on lines 1042 is decrement-and-branch-on-non-zero (OP=001) and the zero-flag is false, the select signal on line 1052 becomes true and the MUX 1038 selects the data field on lines 1040 to be the next microaddress. If the OP field on lines 1042 has any other value, or if it is 001 and the zero-flag is true, then the Q field on lines 1010 is selected to be the next microaddress. This branching function is independent of the conditional multiway branching mechanism of the core inventions of FIGS. 4,5,6, as was described above. It is possible to use both facilities at the same time and thus to branch to one of eight different locations. Those skilled in the art will also recognize that since the counter "sticks" at zero, the counter may be used as a logical flag. It is possible to load a value of one into the counter, perform many other microprogram steps, then decrement and test the counter to branch on the value of that logical flag. Only the first test instruction will branch; subsequent testing of that same flag will not take the branch. Using a value other than one will allow the test to be unsatisfied that number of times, but then be satisfied all subsequent times that it is tested. This is just exactly how a loop counter should operate. The innovation here is to have the loop counter "sticky" at counter=0.

Another preferred implementation of the present invention is generally illustrated in FIG. 12. This implementation joins the logic sequencer core of FIG. 6 with both the stack mechanism of FIG. 8 and FIG. 9 and the counter mechanism of FIG. 10 and FIG. 11. All of the data paths in the details of FIG. 9 and FIG. 11 are fully utilized in the implementation shown in FIG. 12.

The control functions are grouped together now in a single control box 1260. The microaddress MUX 1238 selects among three sources, the Q field on lines 1210 of the pipeline register 1200, the Data field on lines 1240 of the pipeline register 1200 and the top-of-stack value on lines 1258. If the OP field on lines 1242 encodes a RETURN (OP=000) then the signals on lines 1252 select the top-of-stack signal on lines 1258 to become the microaddress. If the OP field 1242 encodes the operation decrement—skip-on-non-zero (OP=001) and the Zero-Flag signal on line 1272 is false, then the signals on lines 1252 select the data field on lines 1240 of the pipeline register 120 to become the microaddress. If neither of the above situations obtains, then the signals on lines 1252 gate the Q field on lines 1210 to become the microaddress.

The advantages of combining the stack and counter functions with the core logic sequencer are all of the advantages of each plus a few which arise from the interaction of the stack and counter mechanisms. The stack may be used to save and restore counter values. The saving of counter values onto the stack is accomplished by using the PUSH-COUNTER instruction (OP=010). The top-of-stack value may be popped and loaded into the counter using the POP-to-COUNTER instruction (OP=100). Saving and restoring counter values allows extended length loop counters to be implemented. Each time the eight least significant bits of the counter decrements to zero, the next higher order eight-bit byte of the counter is popped to the counter and decremented. If this does not make the higher order byte zero, then the higher order byte is pushed back onto the stack and 255 (full scale for an eight bit counter) is loaded into the counter to resume the count. If the higher order byte did decrement to zero, then pop the next higher order byte off of the stack, decrement and test it similarly. When all of the bytes of the counter are zero, the count is completed. For the convenience of the user, the PUSHCOUNTER instruction automatically reloads the counter from the data field on lines 1240 of the pipeline register 1200. In this way the overhead of extended length counters is kept very small. Use of the stack also permits the use of more than one logical flag, as discussed above, by saving and restoring flags which are implemented as counter values.

Often a particular subroutine must be called from several different places in the microprogram, with each place that calls the subroutine needing to make the call a different number of times in a row. The use of the loop counter makes this much easier to do, since the call instruction may be placed inside a loop. Furthermore, the FIFO nature of the stack allows subroutines and extended counters to be nested in arbitrary fashion.

Although FIG. 12 generally illustrates all of the features of the present invention in the form which has been reduced to practice, several elements of the embodiment which has actually been built have not been described herein. These elements are individually well known in the art. These include the use of a high voltage to program the EPROM memory arrays 1218 and 1228 in FIG. 12; the use of the same set of pins twice, once for column address and then later for row address (as is done in high density memory chips for example); the use of tri-stated output pins for data entry during programming of the EPROMs 1218 and 1228; and the use of a simple serial scan path connecting all the internal flip-flops in a shift register for diagnostic and production testing purposes.

All of the embodiments of the present invention have the capacity for horizontal and vertical cascading designed into them. FIG. 13 generally illustrates the method of horizontal cascading, by which several copies of an embodiment of the present invention (shown here under the Altera trade name "EPS448") may be operated in synchronized fashion s that a larger number of output signals may be driven. In this application the programming of each of the EPS448s is identical to the programming of the others except for the programming of the ENABLE (lines 1205 in FIG. 12) and OUTPUT-DATA (lines 1204 in FIG. 12) fields, which differ from part to part. The INPUT signals, the CLOCK signal and the nRESET signal are wired in common to all of the devices. Taken together, the identical control programming and the identity of CLOCK, nRESET and the INPUT signals ensures that the multiple components will run in lock step.

FIG. 14 generally illustrates the vertical cascading of copies of an embodiment of the present invention in order to realize a greater depth of microcode (a longer microprogram.) As in FIG. 13, all of the INPUT signals, the CLOCK and the nREST are wired in common. Furthermore, the OUTPUT signals are also wired together to form a tri-state bus. For vertical cascading the programming is different in each device. The constraint is that only one of the devices is allowed to enable its output drivers at a time. Each device has an active microprogram, during which time that device drives the common output bus, and also a passive microprogram during which it does not drive the common output bus. While a device is in its passive microprogram it is waiting for the conditions which will cause it to re-enter the active micro program. In this way the several devices cooperate to implement a larger microsequencer than any one of them could implement alone.

Although the present invention has been described above in terms of several generally illustrated preferred embodiments, it is understood that after having read this disclosure numerous additional alterations, as well as alternative embodiments will be apparent to those skilled in the art. It is therefore intended that the following claims be interpreted broadly to cover all such alterations, modifications and alternative embodiments as fall within the true spirit and scope of the invention.

What is claimed is:

1. A dynamically programmable integrated circuit logic device comprising:
   a plurality of circuit input terminals;
   a plurality of circuit output terminals;
   a plurality of product term programming input terminals;
   a plurality of sum o product term programming input terminals; a plurality of electrically programmable product term cells organized in a first array of rows and columns, each said product term cell including a first transistor switching element and a second transistor switching element having current electrodes connected in series between circuit ground and a cell node coupled to a source of electrical potential, the control electrode of each said first switching element being connected to a corresponding circuit input terminal, and the control electrode of each said second switching element being connected to a product term programming input terminal; and
   a plurality of electrically programmable sum-of-product term cells organized in a second array of rows and columns with each column thereof corresponding to a column of said first array, each said sum-of-product term cell including a third transistor switching element and a fourth transistor switching element having current electrodes connected in series between circuit ground and a circuit output terminal coupled to a source of electrical potential, the control electrode of each said third switching element being connected to the cell nodes of the product term cells in the corresponding column of said first array, and the control electrode of each said fourth switching means being connected to a sum-of-product term programming input terminal, wherein by the application of appropriate programming signals to said product term programming input terminals and to said sum-of-product programming input terminals, each cell of said logic device m ay be re-programmed during a first portion of any operating cycle to perform a selected Boolean function operation on logic signals applied to said circuit input terminals during a second portion of the same operating cycle to provide circuit output logic signals at said circuit output terminals.

2. A dynamically programmable integrated circuit logic device as recited in claim 1 and further comprising:
   input circuit means for connecting the first switching element of each cell in each odd numbered row of said first array directly to a particular circuit input terminal, and inverter means for indirectly connecting the first switching element of each cell in each even numbered row of said first array to the circuit input terminal to which the cells in the immediately preceding row are directly connected such that when an input data signal is applied to a particular circuit input terminal it is directly applied to each cell of the corresponding row, and the complement of that input signal is applied to each cell of the immediately succeeding row.

3. A dynamically programmable integrated circuit logic device as recited in claim 2 wherein the fourth switching element of each cell of each row in said second array is commonly connected to a single corresponding circuit output terminal.

4. A dynamically programmable integrated circuit logic device as recited in claim 1 and further comprising:
   an addressable memory device having a plurality of memory cells each containing programming signals for application either to one of said product term programming input terminals or to one of said sum-of-product programming input terminals;
   a plurality of program selecting input terminals; and
   decoding means connected between said program selecting input terminals and said memory device and operative to decode signals applied to said program selecting input terminals and develop corresponding address signals which cause selected programming signals stored in said memory device to be applied to said product term programming input terminals and said sum-of-product terms programming terminals.

5. A dynamically programmable integrated circuit logic device as recited in claim 4 and further comprising:
   register means having register input terminals connected to said circuit output terminals, feedback terminals connected to said plurality of program selecting input terminals, and device output terminals, said register means being operative to separate said circuit output logic signals into program select signals for input to said program selecting input terminals, and output data signals, whereby said device may be used as a logic sequencer or a logical state machine.

6. A dynamically programmable associative logic circuit responsive to input program signals and operative to generate output function signals representative of selected Boolean functions of input data signals, comprising:
   a first array of first logic cells each having a first transistor switching element and a second transistor switching element connected in series between a circuit ground an a first cell output terminal, said first logic cells being arranged in orthogonally disposed columns and rows;
   a plurality of input connecting means each associated with particular rows of logic cells in said first array and providing input variables in binary signal form to the control electrode of the first switching element of each logic cell in that row, the binary input signals being individual to each such row;
   a second array of second logic cells each having a third transistor switching element and a fourth switching element connected in series between a second cell output terminal and circuit ground, said second logic cells being arranged in orthogonally disposed columns and rows;
   a plurality of column conductor means each associated with one of the columns of logic cells in each of said first and second arrays and connected to the output terminals of each said first logic cell in that column, each said column conductor means further being connected to the control electrode of a third transistor switching element of at least one of the logic cells in the corresponding column of said second array;
   one or more row conductor means each associated with one of the rows of second logic cells in said second array and connected to the output terminals of each logic cell in that row; and
   programming means for applying programming signals to the control electrode of the second switching element of each first logic cell in said first array and to the control electrode of the fourth switching element of each second logic cell in said second array, said programming signals being operative to effect open and closed circuit paths through the plurality of logic cells to configure said plurality of logic cells to form a logic circuit capable of generating selected output function signals on said row conductor means in response to binary variable signals applied to said plurality of input connecting means.

7. A dynamically programmable integrated circuit logic device as recited in claim 6 and further comprising:
   register means having register input terminals connected to said row conductor means, feedback terminals for coupling a first portion of said output function signals to said programming means, and device output terminals for outputting a second portion of said output function signal, as data signals, whereby said device may be used as a logic sequencer or state machine.

8. An integrated circuit micro-sequencer device having data input terminals and device output terminals comprising:
   memory means for storing predetermined programming signals and for outputting particular ones of said programming signals in response to corresponding address signals being applied to input terminals of said memory means;
   a dynamically programmable logic array including a plurality of electrically programmable product term cells and a plurality of sum-of-product term cells that are simultaneously programmable by said particular programming signals during a first portion of an operating clock cycle, and which perform a selected logic operation on data signals input to the array during a second portion of the same operating clock cycle to generate a corresponding microcode word for output from said array; and
   register means for receiving said microcode word from said programmable logic array and for separating a first field of said word for feedback input to said memory means as a next cycle address signal, and for separating a second field of said microcode word for output to device output terminals.

9. An improved integrated circuit micro-sequencer device as recited in claim 8 wherein said dynamically programmable logic array includes:
   a plurality of circuit input terminals;
   a plurality of circuit output terminals;
   a plurality of product term programming input terminals;
   a plurality of sums of product term programming input terminals;
   a plurality of electrically programmable product term cells organized in a first array of rows and columns, each said product term cell including a first transistor switching element and a second transistor switching element connected in series between circuit ground and a cell node coupled to a source of potential, the control electrode of each said first switching element being connected to a corresponding circuit input terminal, and the control electrode of each said second switching element being coupled to a product term programming input terminal; and a plurality of electrically programmable sum-of-product term cells organized in a second array of rows and columns with each column thereof corresponding to a column of said first array, each said sum-of-product term cell including a third transistor switching element and a fourth transistor switching element connected in series between circuit ground and a circuit output terminal, the control electrode of each said third switching element being connected to the cell nodes of the product term cells in the corresponding column of said first array, and the control electrode of said fourth switching means being connected to a sum-of-product term programming input terminal, wherein by the application of appropriate programming signals to said product term programming input terminals and said sum-of-product programming terminals, each cell of said logic device may be reprogrammed during a first portion of any operating cycle to provide a selected Boolean function operation on logic signals applied to said circuit input terminals during a second portion of the same operating cycle and to develop circuit output logic signals at said circuit output terminals.

10. An integrated circuit micro-sequencer device as recited in claim 9 wherein said dynamically programmable logic array further includes:

input circuit means for connecting the first switching element of each cell in each odd numbered row of said first array directly to a particular input terminal, and inverted means for indirectly connecting the first switching element of each cell in each even numbered row of said first array to the input terminal to which the cells in the immediately preceding row are directly connected such that when an input data signal is applied to a particular circuit input terminal it is directly applied to each cell of the corresponding row, and the complement of that input signal is input to each cell of the next row.

11. An integrated circuit micro-sequencer device as recited in 10 wherein the fourth switching element of each cell of each row in said second array is commonly connected to a single corresponding circuit output terminal.

12. An integrated circuit microsequencer device comprising:

a first memory means for storing predetermined programming signals and for outputting particular programming signals in response to corresponding address signals;

a dynamically programmable logic array including a plurality of electrically programmable product term cells and a plurality of sum-of-product term cells that are simultaneously programmable by input of said particular programming signals during a first portion of an operating clock cycle, and that perform selected logic operations on data signals input to the array during a second portion of the same operating clock cycle to generate corresponding logic signals;

second memory means for storing predetermined microcode words in defined rows and columns, the rows of which are identified by said address signals and the columns of which are identified by said logic signals;

multiplexer means responsive to said logic signals and operative to select from said second memory means and to output through said multiplexer a microcode word defined by said address signals and by said logic signals; and register means for receiving said microcode word from said multiplexer means and for separating a first field of said microcode word for input as next cycle address signals to said first memory means as next address signals, and for separating a second field of said microcode word for output to device output terminals.

13. An improved integrated circuit microsequencer device as recited in claim 12 wherein said register means further separates a third field from said microcode word as an opcode signal, and a fourth field from said microcode word as an auxiliary data signal; and wherein said microsequencer device further comprises:

stack means and stack control means;

second multiplexer means under control of said stack control means and operative to input either said input data signals or said auxiliary data signals into said stack means for temporary storage; and third multiplexer means for selecting either said first field or the data temporarily stored in said stack means for input to said first memory means as its next address signals and to said second memory means as its next address signals.

14. An integrated circuit microsequencer device as recited in claim 13 wherein said register means further separates a third field from said microcode word as an opcode signal, and a fourth field from said microcode word as an auxiliary data signal; and wherein said microsequencer device further comprises:

counter means and counter control means;

fourth multiplexer means under control of said counter control means and operative to input either said input data signals or said auxiliary data signals into said counter means for changing the count therein; and wherein said third multiplexer means selects either said first field or the data temporarily stored in said stack means or the auxiliary data signals for input to said first memory means as its next address signals and to said second memory means as its next address signals.

15. An integrated circuit microsequencer device as recited in claim 12 wherein said register means further separates a third field from said microcode word as an opcode signal, and a fourth field from said microcode word as an auxiliary data signal; and wherein said microsequencer device further comprises:

counter means and counter control means;

second multiplexer means under control of said counter control means and operative to input either said input data signals or said auxiliary data signals into said counter means for changing the count therein; and third multiplexer means for selecting either said first field or said auxiliary data field for input to said first memory means as its next address signals and to said second memory means as its next addressssignals.

16. An integrated circuit microsequencer device comprising:
- a first memory means for storing predetermined programming signals and for outputting particular programming signals in response to corresponding address signals;
- a dynamically programmable logic array including means forming product terms and sum-of-product terms that are programmable by input of said particular programming signals during a first portion of an operating cycle and perform selected logic operations on data signals input to the array during a second portion of the same operating cycle to generate corresponding logic signals;
- second memory means for storing predetermined microcode words in defined rows and columns, the rows of which are identified by said address signals and the columns of which are identified by said logic signals;
- priority encoding means responsive to said logic signals generated by said logic array and operative to develop prioritized logic signals;
- multiplexer means responsive to said prioritized logic signals and operative to select an output from said memory means a microcode word defined by said address signals and said prioritized logic signals; and
- register means for receiving said microcode word from said multiplexer means and for separating a first field of said microcode word for input to said first memory means as next address signals and for input to said second memory means as next address signals, and for separating a second field of said microcode word for output to circuit output terminals.

17. An integrated circuit microsequencer device as recited in claim 16 wherein said register means further separates a third field from said microcode word as an opcode signal, and a fourth field from said microcode word as an auxiliary data signal; and
wherein said microsequencer device further comprises:
- stack means and stack control means;
- second multiplexer means under control of said stack control means and operative to input either said input data signals or said auxiliary data signals into said stack means for temporary storage; and
- third multiplexer means for selecting either said first field or the data temporarily stored in said stack means for input to said first memory means as its next address signals and to said second memory means as its next address signals.

18. An integrated circuit microsequencer device as recited in claim 17
wherein said microsequencer device further comprises:
- counter means and counter control means;
- fourth multiplexer means under control of said counter control means and operative to input either said input data signals or said auxiliary data signals into said counter means for changing the count therein; and
- wherein said third multiplexer means selects either said first field or the data temporarily stored in said stack means or the auxiliary data signals for input to said first memory means as its next address signals and to said second memory means as its next address signals.

19. An integrated circuit microsequencer device as recited in claim 16 wherein said register means further separates a third field from said microcode word as an opcode signal, and a fourth field from said microcode word as an auxiliary data signal; and wherein said microsequencer device further comprises:
- counter means and counter control means;
- second multiplexer means for selecting either said first field or said auxiliary data field for input to said first memory means as its next address signals and to said second memory means as its next address signals; and
- third multiplexer means under control of said counter control means and operative to input either said input data signals or said auxiliary data signals into said counter means for changing the count therein.

* * * * *